(12) United States Patent
Umezaki et al.

(10) Patent No.: US 9,124,288 B2
(45) Date of Patent: Sep. 1, 2015

(54) SEMICONDUCTOR DEVICE

(71) Applicant: Renesas Electronics Corporation, Kawasaki-shi (JP)

(72) Inventors: Takahiro Umezaki, Kawasaki (JP); Yasutaka Horikoshi, Kawasaki (JP); Takehiro Mikami, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/577,618

(22) Filed: Dec. 19, 2014

(65) Prior Publication Data
US 2015/0188557 A1    Jul. 2, 2015

(30) Foreign Application Priority Data

Dec. 27, 2013 (JP) ................................ 2013-272504

(51) Int. Cl.
*H03M 1/10* (2006.01)
*H03M 1/38* (2006.01)

(52) U.S. Cl.
CPC ............... *H03M 1/109* (2013.01); *H03M 1/38* (2013.01)

(58) Field of Classification Search
CPC ......... H03M 1/38; H03M 1/40; H03M 1/403; H03M 1/46; H03M 1/466

USPC .......................... 341/118, 120, 161–163, 172
See application file for complete search history.

(56) References Cited

U.S. PATENT DOCUMENTS

| 4,451,821 | A | * | 5/1984 | Domogalla | ................... | 341/158 |
| 6,714,151 | B2 | * | 3/2004 | Tachibana et al. | ........... | 341/155 |
| 7,170,439 | B1 | * | 1/2007 | Chen | ............................. | 341/172 |
| 7,705,755 | B2 | * | 4/2010 | Yang et al. | .................... | 341/120 |
| 7,786,908 | B2 | * | 8/2010 | Yoshinaga | .................... | 341/118 |
| 7,928,871 | B2 | * | 4/2011 | Aruga et al. | .................. | 341/118 |
| 8,111,178 | B2 | * | 2/2012 | Liao et al. | ..................... | 341/120 |
| 8,242,945 | B2 | | 8/2012 | Sawai | | |
| 8,519,874 | B2 | * | 8/2013 | Aruga et al. | .................. | 341/120 |
| 2009/0121907 | A1 | * | 5/2009 | Kuramochi et al. | .......... | 341/120 |

FOREIGN PATENT DOCUMENTS

| JP | 2001-24509 A | 1/2001 |
| JP | 2011-41231 A | 2/2011 |

* cited by examiner

*Primary Examiner* — Howard Williams
(74) *Attorney, Agent, or Firm* — McGinn IP Law Group, PLLC

(57) ABSTRACT

To determine the accuracy of an AD converter more simply than in the related art, a semiconductor device includes a successive approximation AD converter. The AD converter includes one or a plurality of testing capacitors used in a test mode, separately from a C-DAC used for AD conversion in a normal mode. In the test mode, the accuracy of a capacitor under test among a plurality of capacitors configuring the C-DAC is determined by comparing a potential occurring in the capacitor under test and a potential occurring in the testing capacitors.

6 Claims, 22 Drawing Sheets

US 9,124,288 B2

SEMICONDUCTOR DEVICE

CROSS-REFERENCE TO RELATED APPLICATIONS

The disclosure of Japanese Patent Application No. 2013-272504 filed on Dec. 27, 2013 including the specification, drawings and abstract is incorporated herein by reference in its entirety.

BACKGROUND

The present invention relates to a semiconductor device, and particularly to a semiconductor device incorporating a successive approximation analog-to-digital (AD) converter.

Recently, to achieve more accurate control, the resolution of a successive approximation AD converter (ADC) incorporated in a microcontroller or the like has been increasing. To achieve high-accuracy AD conversion, it is important to confirm that the AD converter maintains the initial accuracy.

In the related art, to confirm the accuracy of the AD converter in actual use, it is necessary to prepare a dedicated evaluation program and environment. More specifically, a high-accuracy external input voltage or internal reference voltage is provided as analog input to an AD converter, and the conversion result (code) of AD-converting this analog input voltage is compared with an expected value, so that the AD conversion accuracy is confirmed (e.g., Japanese Unexamined Patent Publication No. 2011-41231 (Patent Document 1) and Japanese Unexamined Patent Publication No. 2001-24509 (Patent Document 2)).

SUMMARY

In recent years, generally, the successive approximation AD converter includes a main DAC (Digital-to-Analog Converter) and a sub-DAC. In general, the main DAC is configured as a C-DAC in which a plurality of capacitors coupled in parallel, and the sub-DAC is configured as an R-DAC including a resistor array or a resistor ladder. For example, in the case of a 12-bit AD converter, the C-DAC is used for AD conversion of higher-order 8 bits, and the R-DAC is used for AD conversion of lower-order 4 bits.

In general, MOS (Metal Oxide Semiconductor) capacitors are used as capacitors configuring the C-DAC. It is known that the capacitance value of the MOS capacitor varies with time due to NBTI (Negative Bias Temperature Instability), TDDB (Time Dependent Dielectric Breakdown), etc. NBTI refers to a phenomenon in which a threshold voltage varies when a negative bias is applied to a MOS transistor by instantaneous potential variation of an input signal due to overshoot, undershoot, etc. In this case, the capacitance value of the MOS capacitor varies according to the variation of the threshold voltage. TDDB refers to a phenomenon in which a dielectric breakdown of an oxide film occurs with time in a low electric field in actual use.

Accordingly, to ensure the accuracy of the AD converter, special attention is needed for the temporal variation of the capacitance value of each individual capacitor. It is important that the capacitance value of each capacitor configuring the C-DAC requires e.g. an accuracy of 12 bits to ensure the accuracy of the 12-bit AD converter configured with the C-DAC (higher-order 8 bits) and the R-DAC (lower-order 4 bits).

For the above reason, to diagnose the accuracy of each capacitor configuring the C-DAC in the related art for comparing the AD conversion value of the analog input signal with the expected value, the analog input signal requires a resolution of 12 bits. Accordingly, it requires time and effort to determine the accuracy of the AD converter in the related art.

The other problems and novel features will become apparent from the description of this specification and the accompanying drawings.

A semiconductor device according to one embodiment includes a successive approximation AD converter. The AD converter includes one or a plurality of testing capacitors used in a test mode, separately from a C-DAC used for AD conversion in a normal mode. In the test mode, the accuracy of a capacitor under test among a plurality of capacitors configuring the C-DAC is determined by comparing a potential occurring in the capacitor under test and a potential occurring in the testing capacitors.

According to the above one embodiment, it is possible to determine the accuracy of the AD converter more simply than in the related art.

DETAILED DESCRIPTION

Figure 1:
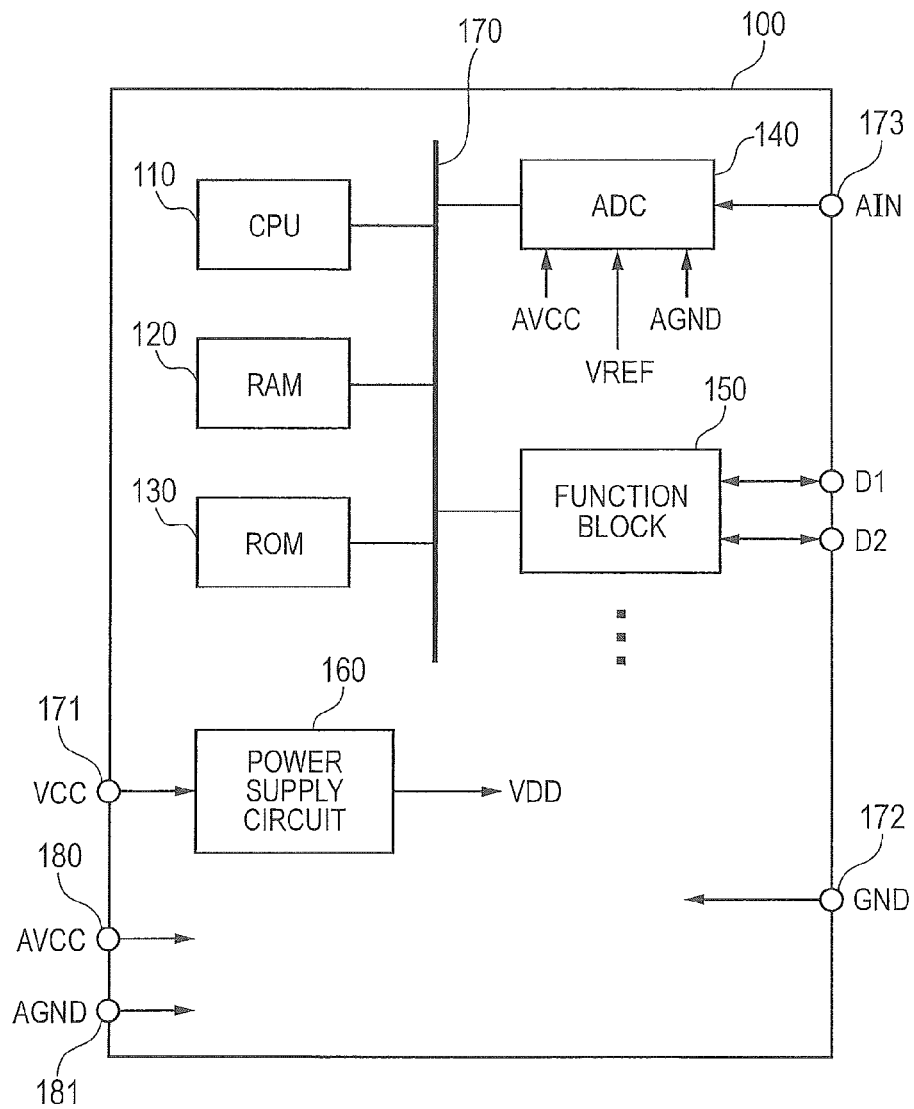
FIG. 1 is a diagram showing an example of the configuration of a semiconductor device according to various embodiments.

Hereinafter, various embodiments will be described in detail with reference to the drawings. The same or equivalent parts are denoted by the same reference numerals, and their description will not be repeated.

First Embodiment

Configuration Example of Semiconductor Device

FIG. 1 is a diagram showing an example of the configuration of a semiconductor device or a semiconductor integrated circuit device according to various embodiments. In FIG. 1, the configuration of a microcomputer is shown as an example of the semiconductor device.

Referring to FIG. 1, a microcomputer 100 is formed over a semiconductor substrate (semiconductor chip) made of e.g. monocrystalline silicon, using a known CMOS manufacturing method. The microcomputer 100 includes a CPU (Central Processing Unit) 110, a RAM (Random Access Memory) 120, a ROM (Read Only Memory) 130, an AD converter 140, and other function blocks 150 including an input/output interface. These function blocks are coupled to each other via a bus 170.

The CPU 110 controls the whole of the microcomputer 100 and performs arithmetic processing by executing a program. The RAM 120 and the ROM 130 are used as main memory of the CPU 110.

The ADC 140 has a normal mode for converting an analog signal AIN inputted from an input terminal 173 into a digital value and a test mode for determining the accuracy of each capacitor configuring an incorporated C-DAC, as operation modes. The analog signal AIN inputted from the input terminal 173 is once held in a sample hold (S/H) circuit 50 in FIG. 2.

The microcomputer 100 further includes a power supply circuit 160 for generating a power supply potential VDD for digital circuits supplied to the function blocks 110, 120, 130, and 150, based on an external power supply voltage VCC inputted from a power supply terminal 171. The microcomputer 100 further has a power supply terminal 180 for receiving an external power supply potential AVCC for analog circuits supplied to the AD converter 140, a ground terminal 181 for receiving a ground potential AGND for analog circuits, and the like. In this embodiment, a reference potential VREF supplied to the AD converter 140 is generated from the external power supply potential AVCC for analog circuits, and is equal to the external power supply potential AVCC (AVCC=VREF). A dedicated external terminal for receiving the reference potential VREF may be provided. A ground potential GND for digital circuits supplied to the function blocks 110, 120, 130, and 150 is provided to a ground terminal 172 of the microcomputer 100. The separation of the external power supply potential AVCC and the ground potential AGND for analog circuits from the power supply potential VDD and the ground potential GND for digital circuits reduces the influence of power supply noise caused by the operation of digital circuits on the operation of analog circuits. The external power supply potential AVCC and the ground potential AGND are supplied to later-described circuits in FIGS. 2, 8, 11, 14, 17, and 20. The microcomputer 100 further has data input/output terminals D1, D2 coupled to the function block 150 such as the input/output interface.

Configuration of Successive Approximation AD Converter

Figure 2:
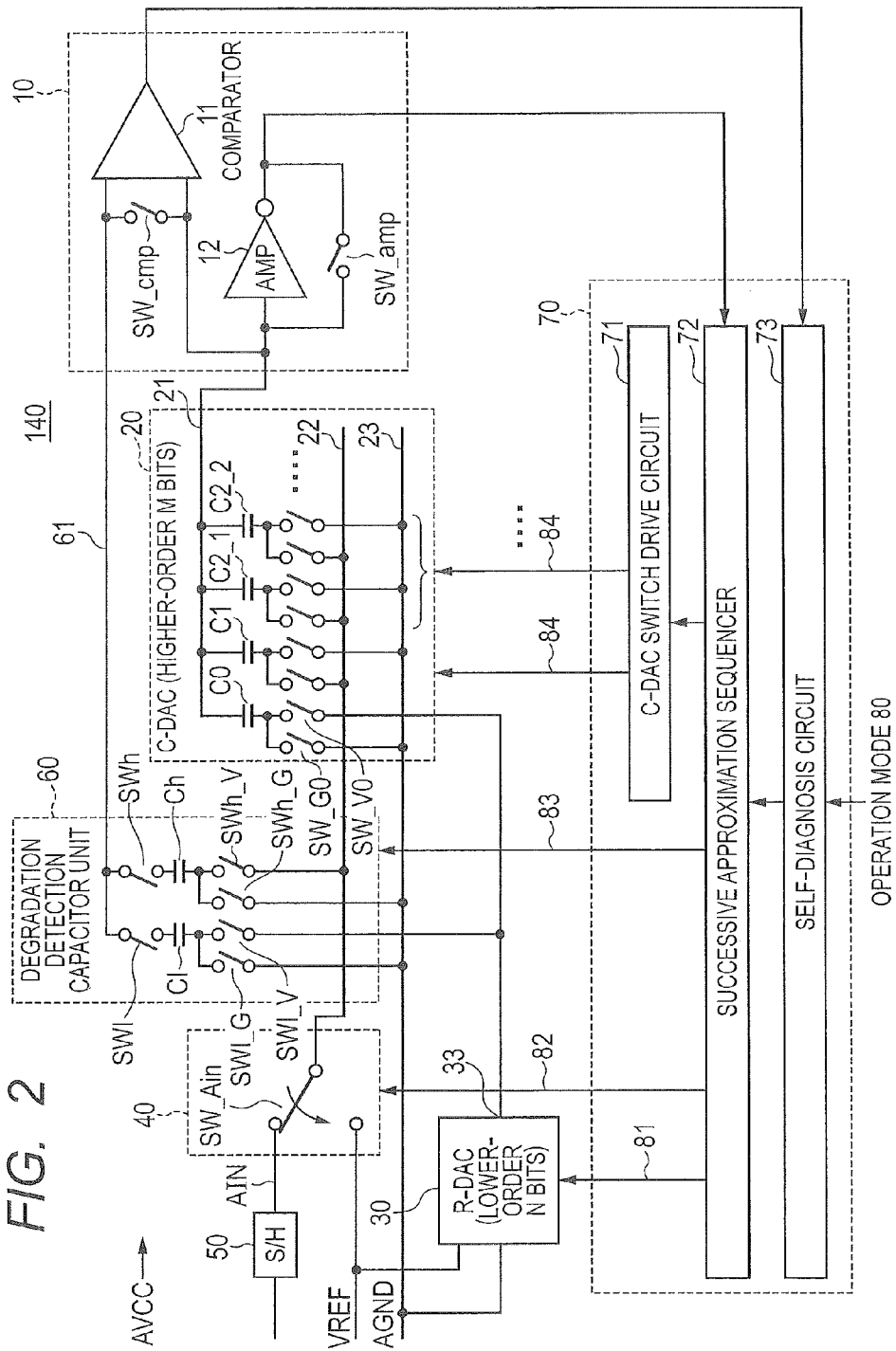
FIG. 2 is a block diagram showing the configuration of a successive approximation AD converter 140 provided in a semiconductor device according to a first embodiment.

FIG. 2 is a block diagram showing the configuration of the successive approximation AD converter 140 provided in a semiconductor device according to the first embodiment. Referring to FIG. 2, the AD converter 140 includes an input signal switching unit 40, a comparison unit 10, a C-DAC 20, an R-DAC 30, a sample hold circuit 50, a degradation detection capacitor unit 60, and a control unit 70.

The input signal switching unit 40 includes a 2-input/1-output (identified as 1-input/2-output-because the signal can be transmitted bidirectionally) switch SW_Ain. An analog input signal Ain is inputted through the sample hold circuit 50 to one input node of the switch SW_Ain. The reference potential VREF is inputted to the other input node of the switch SW_Ain.

The comparison unit 10 includes an amplifier (AMP) 12 used in the normal mode, a comparator 11 used in the test mode, a switch SW_amp coupled between the input and output nodes of the amplifier 12, and a switch SW_cmp coupled between the two input nodes of the comparator 11.

Figure 3:
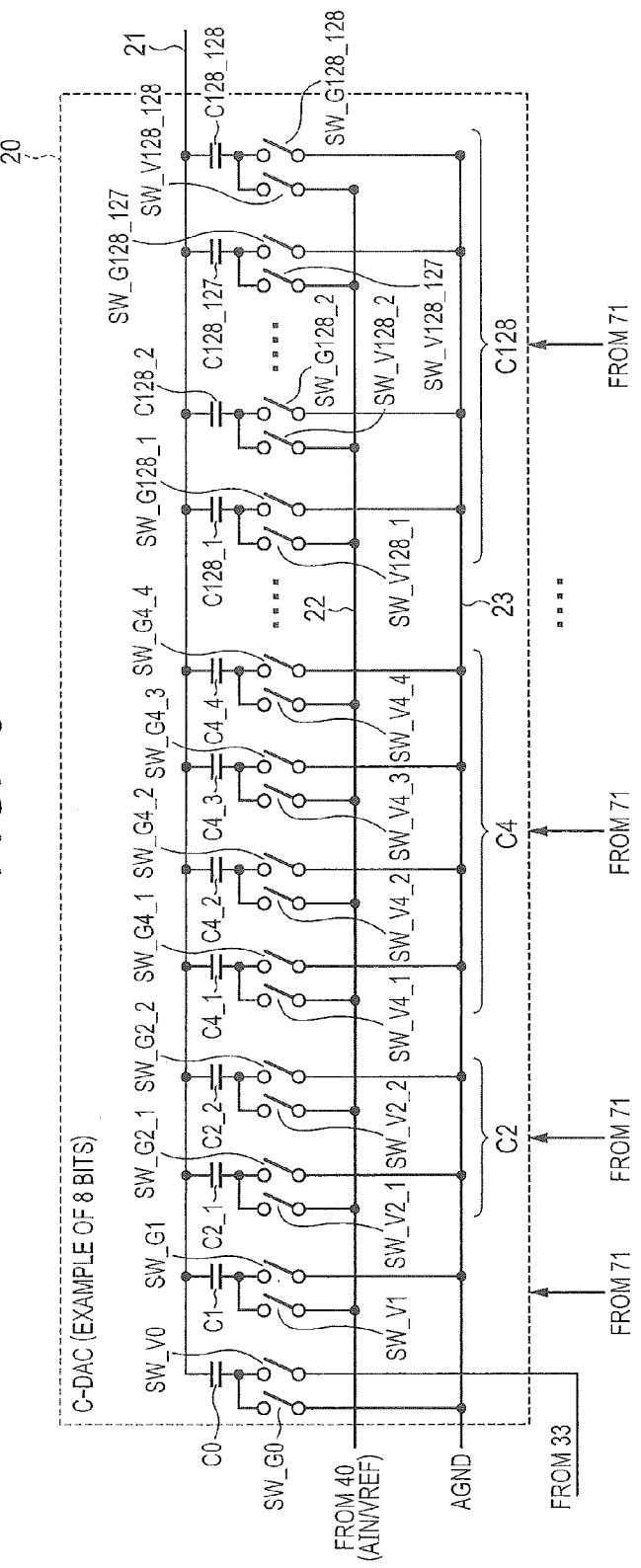
FIG. 3 is a circuit diagram showing the detailed configuration of a C-DAC.

The C-DAC 20 is used for AD conversion of higher-order m bits. FIG. 3 is a circuit diagram showing the detailed configuration of the C-DAC. In FIG. 3, the configuration in the case of m=8 is shown. Referring to FIGS. 2 and 3, the C-DAC 20 includes a signal output line 21, a voltage line 22, a ground line 23, a plurality of parallel-coupled capacitors, and a plurality of switches.

The signal output line 21 is coupled to one input node of the comparator 11 and the input node of the amplifier 12. The voltage line 22 is coupled to the output node of the switch SW_Ain of the input signal switching unit 40. The ground potential AGND is provided to the ground line 23.

In the case of the 8-bit C-DAC, the C-DAC 20 includes 256 MOS capacitors and 512 switches. Each capacitor is coupled to two corresponding switches. Each capacitor is designed and produced so as to have the same gate size and capacitance. The 256 capacitors are divided into 9 groups.

More specifically, a first group (also referred to as a C0 group) is configured with one MOS capacitor C0. One end of the capacitor C0 is coupled to the signal output line 21, and the other end is coupled through corresponding switches SW_G0 and SW_V0 to the ground line 23 and an output node 33 of the R-DAC 30 respectively.

A second group (also referred to as a C1 group) is configured with one MOS capacitor C1. One end of the MOS capacitor C1 is coupled to the signal output line 21, and the other end is coupled through corresponding switches SW_V1 and SW_G1 to the voltage line 22 and the ground line 23 respectively.

A third group (also referred to as a C2 group) is configured with two MOS capacitors C2_1 and C2_2. One end of the MOS capacitor C2_1 is coupled to the signal output line 21, and the other end is coupled through corresponding switches SW_V2_1 and SW_G2_1 to the voltage line 22 and the ground line 23 respectively. One end of the MOS capacitor C2_2 is coupled to the signal output line 21, and the other end is coupled through corresponding switches SW_V2_2 and SW_G2_2 to the voltage line 22 and the ground line 23 respectively.

A fourth group (also referred to as a C4 group) is configured with four MOS capacitors C4_1 to C4_4. One end of each MOS capacitor C4_$i$ ($i$=1 to 4) is coupled to the signal output line 21, and the other end is coupled through corresponding switches SW_V4_$i$ and SW_G4_$i$ to the voltage line 22 and the ground line 23 respectively.

Although not shown in FIG. 3, similarly, a fifth group (also referred to as a C8 group) is configured with eight MOS capacitors C8_1 to C8_8. One end of each MOS capacitor C8_$i$ ($i$=1 to 8) is coupled to the signal output line 21, and the other end is coupled through corresponding switches SW_V8_$i$ and SW_G8_$i$ to the voltage line 22 and the ground line 23 respectively.

A sixth group (also referred to as a C16 group) is configured with 16 MOS capacitors C16_1 to C16_16. One end of each MOS capacitor C16_$i$ ($i$=1 to 16) is coupled to the signal output line 21, and the other end is coupled through corresponding switches SW_V16_$i$ and SW_G16_$i$ to the voltage line 22 and the ground line 23 respectively.

A seventh group (also referred to as a C32 group) is configured with 32 MOS capacitors C32_1 to C32_32. One end of each MOS capacitor C32_$i$ ($i$=1 to 32) is coupled to the signal output line 21, and the other end is coupled through corresponding switches SW_V32_$i$ and SW_G32_$i$ to the voltage line 22 and the ground line 23 respectively.

An eighth group (also referred to as a C64 group) is configured with 64 MOS capacitors C64_1 to C64_64. One end of each MOS capacitor C64_$i$ ($i$=1 to 64) is coupled to the signal output line 21, and the other end is coupled through corresponding switches SW_V64_$i$ and SW_G64_$i$ to the voltage line 22 and the ground line 23 respectively.

A ninth group (also referred to as a C128 group) is configured with 128 MOS capacitors C128_1 to C128_128. One end of each MOS capacitor C128_$i$ ($i$=1 to 128) is coupled to the signal output line 21, and the other end is coupled through corresponding switches SW_V128_$i$ and SW_G128_$i$ to the voltage line 22 and the ground line 23 respectively.

The number of capacitors in each group corresponds to the weighting of the higher-order bits. Accordingly, in the normal mode, the switches of each group are opened/closed collectively in each group. On the other hand, in the test mode for determining the accuracy of each capacitor configuring the C-DAC 20, the switches of each capacitor are opened/closed individually for each capacitor.

Figure 4:
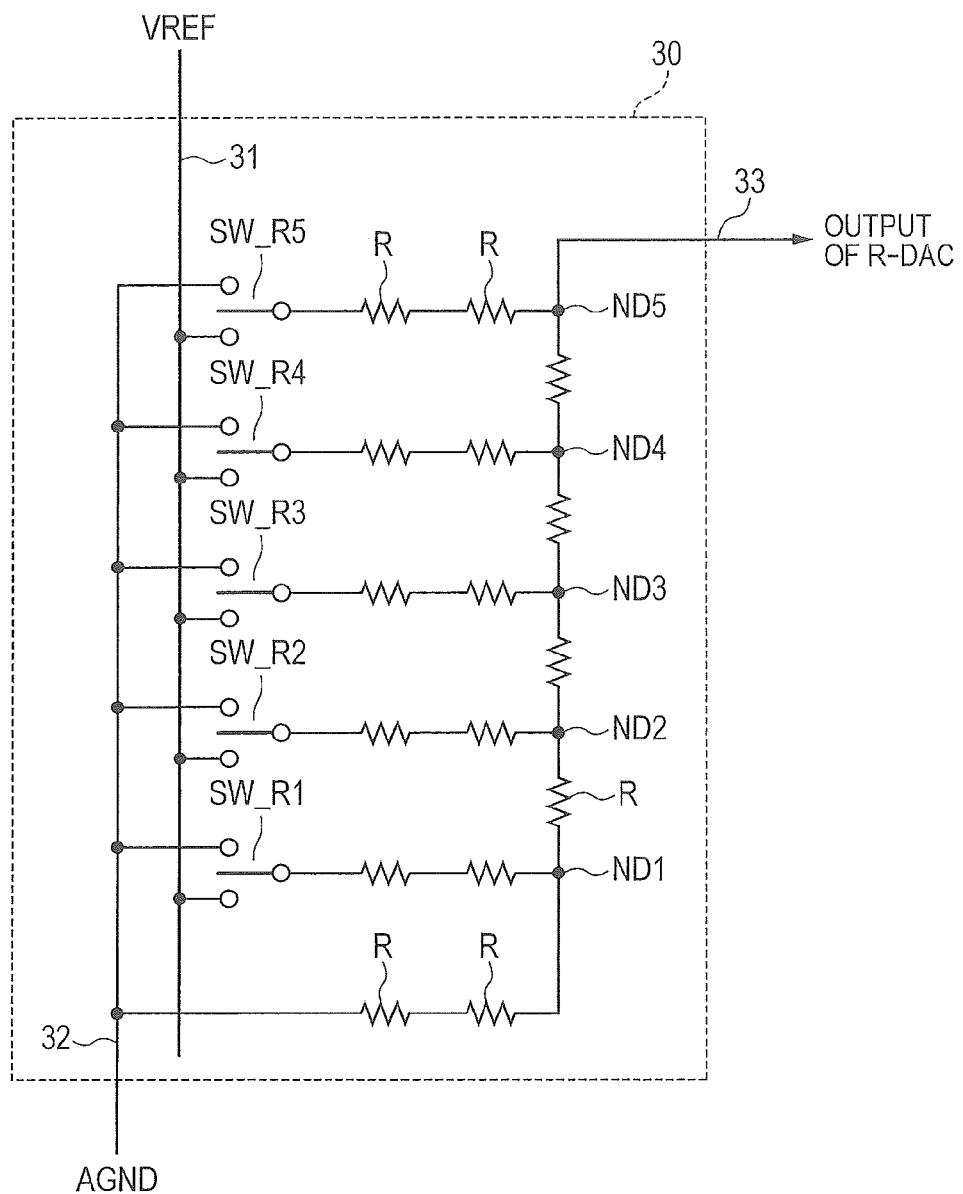
FIG. 4 is a circuit diagram showing the detailed configuration of an R-DAC.

Referring again to FIG. 2, the R-DAC 30 is used for AD conversion of lower-order n bits. FIG. 4 is a circuit diagram showing the detailed configuration of the R-DAC. In FIG. 4, the configuration of a 5-bit voltage addition type R-2R ladder circuit is shown. Four of five bits are used for AD conversion of lower-order 4 bits (n=4), and the remaining 1 bit is used for voltage adjustment (self-healing function) in the case of a change in the capacitance value of a capacitor.

Referring to FIGS. 2 and 4, the R-DAC 30 includes a voltage line 31 to which the reference potential VREF is provided, a ground line 32 to which the ground potential AGND is provided, nodes ND1 to ND5, 2-input/1-output (identified as 1-input/2-output because the signal can be transmitted bidirectionally) switches SW_R1 to SW_R5, and 16 resistive elements (resistance value: R).

The adjacent nodes ND1 and ND2, ND2 and ND3, ND3 and ND4, and ND4 and ND5 each have one resistive element (resistance value: R) coupled therebetween. The node ND5 is coupled to the output node 33 of the R-DAC 30. The node ND1 is coupled through two resistive elements (resistance value: 2×R) to ground line 32.

One input node of each of the switches SW_R1 to SW_R5 is coupled to the voltage line 31, and the other input node is coupled to the ground line 32. The output nodes of the switches SW_R1 to SW_R5 are coupled through two resistive elements (resistance value: 2×R) to the nodes ND1 to ND5, respectively.

With the above configuration, in the case where only the switch SW_R5 is coupled to the voltage line 31 and the other switches are coupled to the ground line 32, the potential of (16/32)×VREF is outputted from the output node 33. In the case where only the switch SW_R4 is coupled to the voltage line 31 and the other switches are coupled to the ground line 32, the potential of (8/32)×VREF is outputted from the output node 33. In the case where only the switch SW_R3 is coupled to the voltage line 31 and the other switches are coupled to the ground line 32, the potential of (4/32)×VREF is outputted from the output node 33. In the case where only the switch SW_R2 is coupled to the voltage line 31 and the other switches are coupled to the ground line 32, the potential of (2/32)×VREF is outputted from the output node 33. In the case where only the switch SW_R1 is coupled to the voltage line 31 and the other switches are coupled to the ground line 32, the potential of (1/32)×VREF is outputted from the output node 33. Further, from the combination thereof, the R-DAC 30 can output 31 different potentials from 0 to (31/32)×VREF.

The degradation detection capacitor unit 60 includes MOS capacitors Cl and Ch and switches SWl, SWl_G, SWl_V, SWh, SWh_G, and SWh_V. One end of the MOS capacitor Cl is coupled through the switch SWl to a voltage line 61, and coupled through the voltage line 61 to the other input node (different side from the signal output line 21) of the comparator 11. The other end of the MOS capacitor Cl is coupled through the switches SWl_G and SWl_V to the ground line 23 and the output node of the R-DAC 30 respectively. One end of the MOS capacitor Ch is coupled through the switch SWh to the voltage line 61. The other end of the MOS capacitor Ch is coupled through the switches SWh_G and SWh_V to the ground line 23 and the voltage line 22 respectively.

The MOS capacitors Cl and Ch are designed and produced so as to have the same gate size and capacitance as each capacitor configuring the C-DAC 20. The MOS capacitors Cl and Ch are used only in the test mode for each capacitor configuring the C-DAC 20, and are hard to degrade by NBTI, TDDB, etc. Accordingly, it is possible to accurately and simply determine whether or not the capacitance of each capacitor configuring the C-DAC 20 is correct by comparing a voltage generated in each capacitor configuring the C-DAC 20 with a voltage generated in the MOS capacitors Cl and Ch. The control unit 70 includes a C-DAC switch drive circuit 71, a successive approximation sequencer 72, and a self-diagnosis circuit 73.

The successive approximation sequencer 72 outputs a control signal 81 for controlling the switching of the switches included in the R-DAC 30, a control signal 82 for controlling the switching of the switch SW_Ain of the input signal switching unit 40, and a control signal 83 for controlling the switching of the switches included in the degradation detection capacitor unit 60. The successive approximation sequencer 72 further outputs a control signal 84 for controlling the switching of the switches included in the C-DAC 20 through the switch drive circuit 71.

In the normal mode, the successive approximation sequencer 72 controls the switching of switches included in the R-DAC 30, the input signal switching unit 40, and the C-DAC 20, thereby determining a digital value (code) corresponding to the input analog signal Ain, using binary search.

The self-diagnosis circuit 73 controls the successive approximation sequencer 72, based on a signal 80 indicating the operation mode (normal mode, test mode) supplied from the CPU 110 in FIG. 1. In the test mode, the successive approximation sequencer 72 controls the switching of switches included in the C-DAC 20, the R-DAC 30, and the degradation detection capacitor unit 60, thereby determining the accuracy of each MOS capacitor configuring the C-DAC 20. Further, in the test mode, the switch SW_Ain of the input signal switching unit 40 is switched to the reference potential VREF at all times.

Operation in Normal Mode

Hereinafter, the operation of the AD converter 140 in the normal mode will be briefly described. In the normal mode, all the switches included in the degradation detection capacitor unit 60 are turned off. Thereby, the MOS capacitors Cl and Ch are decoupled from the circuits. The comparator 11 is in a non-operating state, and the switch SW_cmp on the input side of the comparator 11 is turned off.

The switch SW_G0 coupled to the MOS capacitor C0 is turned off at all times, and the switch SW_V0 is turned on at all times. Therefore, the output voltage of the R-DAC 30 is applied to one end of the capacitor C0 in the normal mode.

Figure 5:
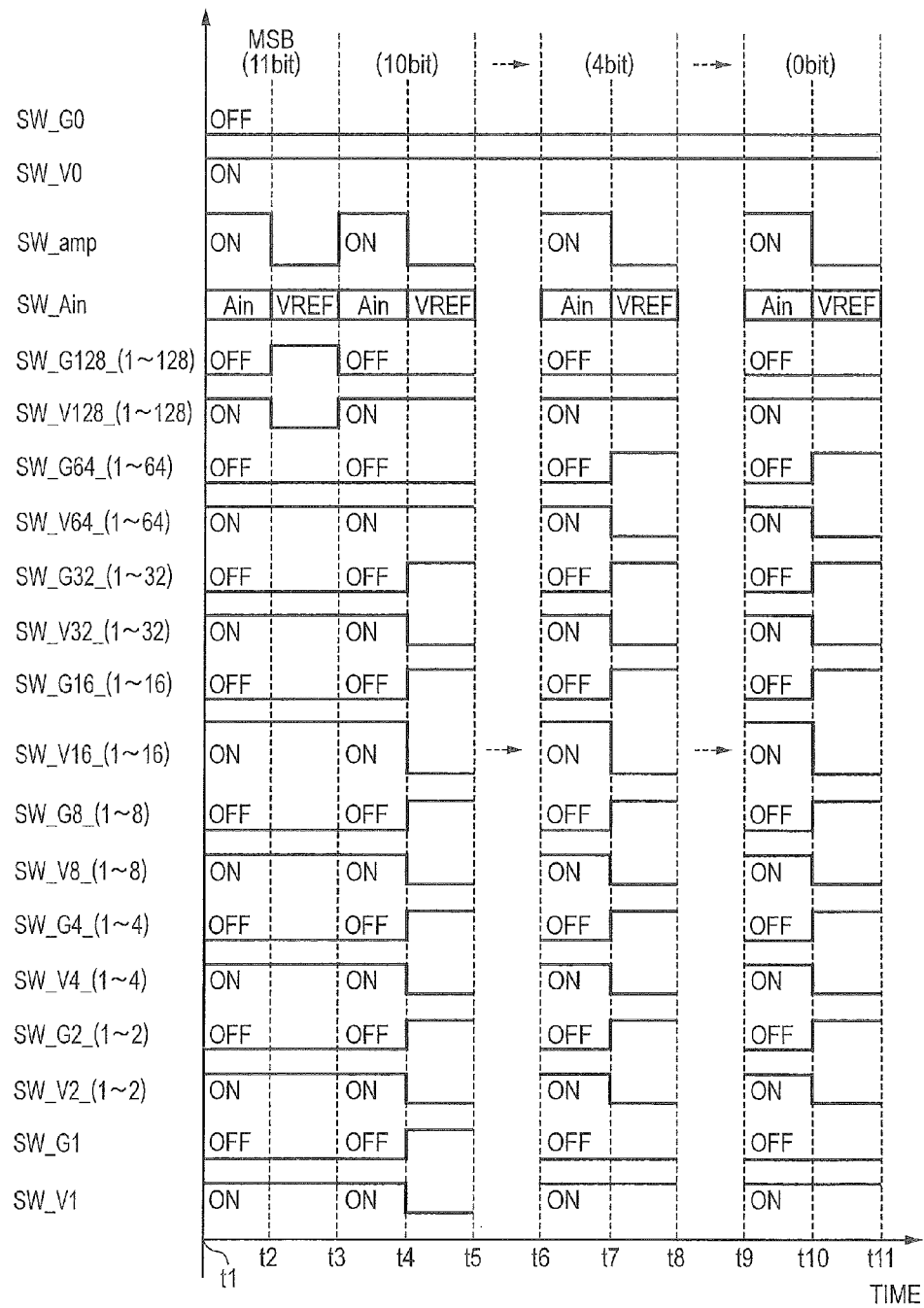
FIG. 5 is a timing chart for explaining the operation in a normal mode of the AD converter 140 in FIG. 2.

FIG. 5 is a timing chart for explaining the operation in the normal mode of the AD converter 140 in FIG. 2. Referring to FIGS. 2, 3, and 5, in the normal mode, the value of each bit is determined by binary search in order from the most significant bit (MSB). In the example of FIG. 5, the most significant bit is the 11th bit. Values from the 11th bit (MSB) to the 4th bit are determined by switching the output of the C-DAC 20. During this time, the output voltage of the R-DAC 30 is zero.

More specifically, between times t1 and t2 in FIG. 5, the input side of the switch SW_Ain is switched to the analog signal Ain. The analog signal Ain is inputted to one end of each MOS capacitor configuring the groups C1 to C128 in the C-DAC 20. Further, the switch SW_amp for coupling the input and output nodes of the amplifier 12 is turned on. Thereby, the potential of the signal output line 21 is set to the potential of the output node of the amplifier AMP, that is, an intermediate reference potential between the reference potential VREF and the ground potential AGND. Alternatively, a predetermined potential may be provided to the signal output line 21.

Then, between times t2 and t3, the input side of the switch SW_Ain is switched to the reference potential VREF. In order that the ground potential AGND is inputted to one end of each MOS capacitor configuring the group C128 in the C-DAC 20, the corresponding switches are switched. Further, the switch SW_amp for coupling the input and output nodes of the amplifier 12 is turned off. Thereby, a potential according to the potential difference between the potential of the analog signal Ain and VREF/2 occurs on the signal output line 21. The output of the amplifier 12 is switched to a high level (H level) or a low level (L level) in accordance with the potential of the signal output line 21. The successive approximation sequencer 72 determines the value of the 11th bit of the input signal Ain, based on the output of the amplifier 12. In this example, the value of the 11th bit of the input signal Ain is assumed to be "1".

Then, between times t3 and t5, the value of the 10th bit of the input signal Ain is determined. More specifically, between times t3 and t4 as between times t1 and t2, the potential of the signal output line 21 is set to the intermediate reference potential between the reference potential VREF and the ground potential AGND. Then, between times t4 and t5, the reference potential VREF is inputted to one end of each capacitor configuring the groups C64 and C128 in the C-DAC 20, and the ground potential AGND is inputted to one end of each capacitor configuring the groups C1 to C32. Thereby, the potential of the analog signal Ain and a potential corresponding to a code "11000000" are compared. As a result, the value of the 10th bit of the analog signal Ain is determined.

In the same way, by switching the potential inputted to one end of each MOS capacitor in the groups C1 to C128 configuring the C-DAC 20, a code from the 11th bit to the 4th bit is determined to be "10000001". A value from the 3rd bit to the 0th bit is determined using binary search by switching each switch in the R-DAC shown in FIG. 4. Thus, a 12-bit code (from the 11th bit (MSB) to the 0th bit (LSB)) corresponding to the voltage value of the input signal Ain is determined.

Operation in Test Mode

In the test mode, the accuracy of each MOS capacitor configuring the groups C1 to C128 in the C-DAC 20 is individually tested.

More specifically, in the first stage, VREF×(1/16), i.e., a potential corresponding to 1LSB (Least Significant Bit) is inputted to one end of the capacitor C1 configuring the degradation detection capacitor unit 60, and the reference potential VREF is inputted to one end of the capacitor Ch. The reference potential VREF is individually inputted to one end of each MOS capacitor configuring the groups C1 to C128 in the C-DAC 20. At this time, the potential of the signal output line 21 and the potential of the voltage line 61 are compared by the comparator 11. Thereby, it is determined whether or not there is a capacitance increase corresponding to 1LSB in each MOS capacitor. In the test mode, the amplifier 12 is in a non-operating state, and the switch SW_amp is turned off.

Then, in the second stage, the reference potential VREF is inputted to one end of the capacitor Ch configuring the degradation detection capacitor unit 60. The capacitor Cl is decoupled from the circuits by the corresponding switches. On the other hand, VREF×(1/16) is inputted to one end of the MOS capacitor C0, and the reference potential VREF is individually inputted to one end of each MOS capacitor configuring the groups C1 to C128. At this time, the potential of the signal output line 21 and the potential of the voltage line 61 are compared by the comparator 11. Thereby, it is tested whether or not there is a capacitance decrease corresponding to 1LSB in each MOS capacitor. Hereinafter, specific description will be made with reference to drawings.

Figure 6:
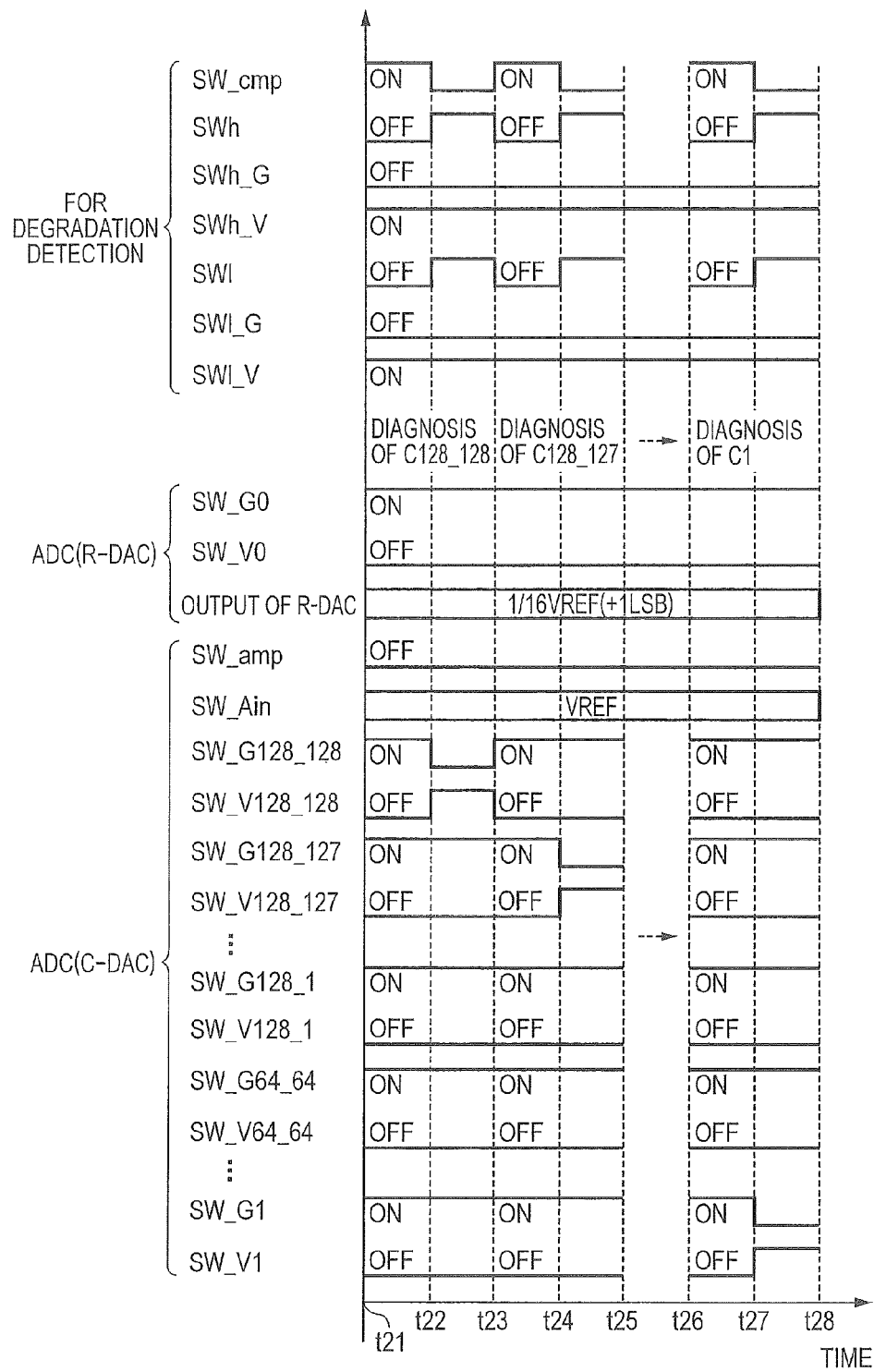
FIG. 6 is a timing chart for explaining the operation in a test mode (first stage) of the AD converter 140 in FIG. 2.

FIG. 6 is a timing chart for explaining the operation in the test mode (first stage) of the AD converter 140 in FIG. 2. Referring to FIGS. 2, 3, and 6, in the test mode (first stage), from the MOS capacitor C128_128 to the MOS capacitor C1, the accuracy of the capacitance value of each capacitor is determined individually in order. In the first stage, the switches SWl_G and SWh_G are fixed to the off state. The switches SWl_V and SWh_V are fixed to the on state. The switch SW_G0 coupled to the capacitor C0 is fixed to the on state, and the switch SW_V0 is fixed to the off state. The output of the R-DAC is fixed to VREF×(1/16), i.e., the voltage corresponding to 1LSB. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the switches SWh and SWl in the degradation detection capacitor unit 60 are turned off; accordingly, the capacitors Cl and Ch are decoupled from the input node of the comparator 11. The ground potential AGND is inputted to one end of each capacitor configuring the groups C1 to C128 in the C-DAC 20. The switch SW_cmp on the input side of the comparator 11 is turned on; accordingly, the signal output line 21 and the voltage line 61 are set to the same potential. The intermediate potential between the reference potential VREF and the ground potential AGND occurs on the output of the comparator 11. Alternatively, a predetermined potential may be provided to the signal output line 21 and the voltage line 61.

Then, between times t22 and t23, the switch SW_cmp is switched to the off state. The switches SWh and SWl in the degradation detection capacitor unit 60 are turned on; accordingly, the capacitors Cl and Ch are coupled to the input node of the comparator 11. Further, in order that the reference potential VREF is inputted to one end of the capacitor C128_128 under determination, the corresponding switches are switched. At this time, the potential of the signal output line 21 and the potential of the voltage line 61 are compared by the comparator 11. Thereby, it is determined whether or not there is a capacitance increase corresponding to 1LSB in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switches SWh and SWl are switched to the on state, and the reference potential VREF is inputted to one end of the capacitor C128_127 under determination. Based on the output of the comparator 11 at this time, it is determined whether or not there is a capacitance increase corresponding to 1LSB in the capacitor C128_127.

In the same way, it is determined whether or not there is a capacitance increase corresponding to 1LSB in each capacitance value of the MOS capacitors C128_126 to C1.

Figure 7:
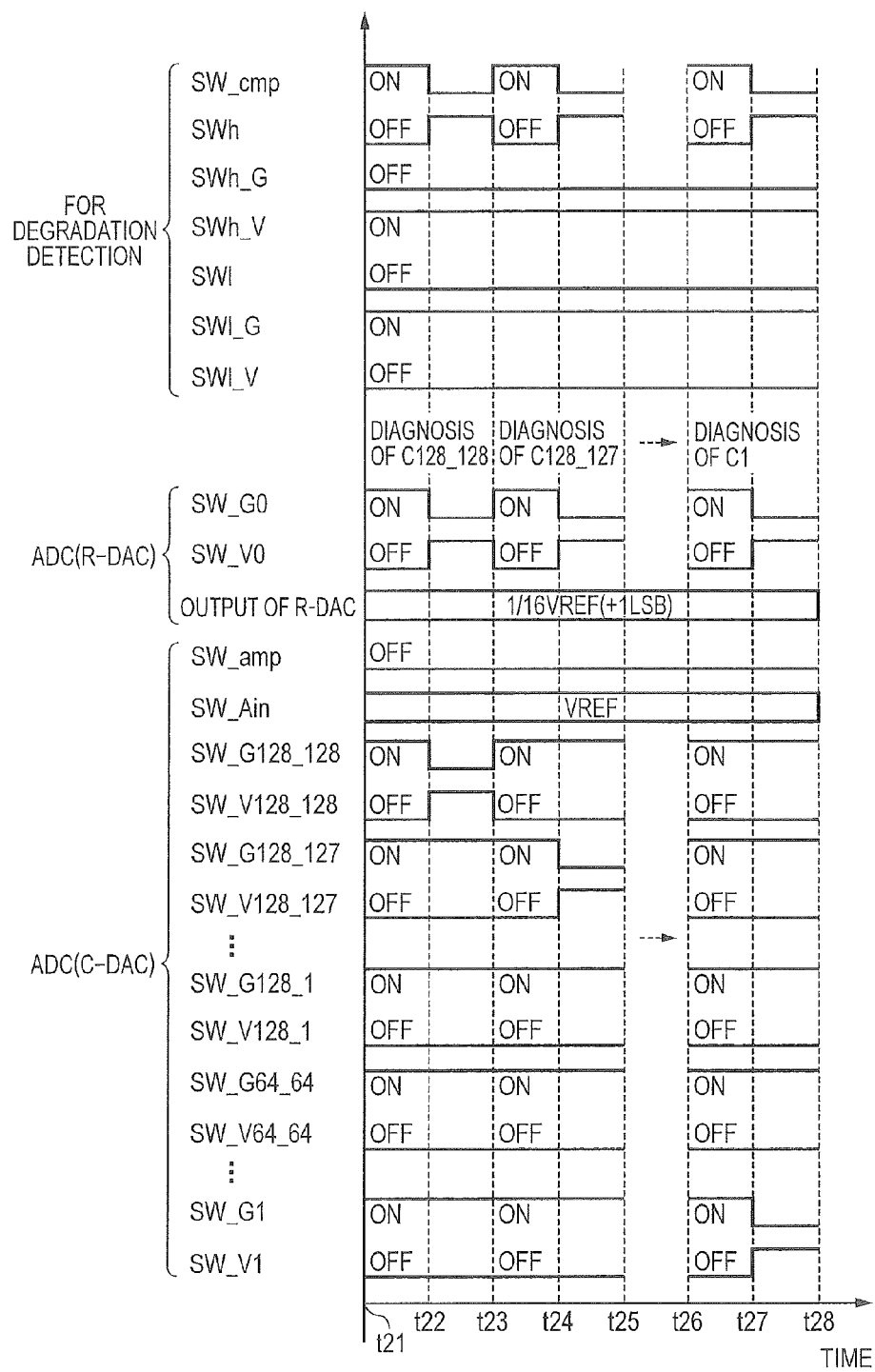
FIG. 7 is a timing chart for explaining the operation in the test mode (second stage) of the AD converter 140 in FIG. 2.

FIG. 7 is a timing chart for explaining the operation in the test mode (second stage) of the AD converter 140 in FIG. 2. Referring to FIGS. 2, 3, and 7, in the second stage as in the first stage, from the MOS capacitor C128_128 to the MOS capacitor C1, the accuracy of the capacitance value of each capacitor is determined individually in order. In the test mode (second stage), the MOS capacitor C1 in the degradation detection capacitor unit 60 is not used; accordingly, the switch SWl is fixed to the off state. The open/close state of the other switches in the degradation detection capacitor unit 60 is the same as in the first stage. In the same way as in the first stage, the output of the R-DAC is fixed to VREF×(1/16), i.e., the voltage corresponding to 1LSB. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the switch SW_cmp on the input side of the comparator 11 is turned on. The switch SWh in the degradation detection capacitor unit 60 is turned off; accordingly, the capacitor Ch is decoupled from the input node of the comparator 11. The ground potential AGND is inputted to one end of each capacitor configuring the groups C0 to C128 in the C-DAC 20. Thereby, the signal output line 21 and the voltage line 61 are set to the same potential, and the intermediate potential between the reference potential VREF and the ground potential AGND occurs on the output of the comparator 11. Alternatively, a predetermined potential may be provided to the signal output line 21.

Then, between times t22 and t23, the switch SW_cmp is switched to the off state. The switch SWh in the degradation detection capacitor unit 60 is turned on; accordingly, the capacitor Ch is coupled to the input node of the comparator 11. Further, in order that the reference potential VREF is inputted to one end of the capacitor C128_128 under determination, the corresponding switches SW_G128_128, SW_V128_128 are switched, and in order that VREF×1/16 is inputted to one end of the capacitor C0, the corresponding switches SW_G0, SW_V0 are switched. At this time, the potential of the signal output line 21 and the potential of the voltage line 61 are compared by the comparator 11. Thereby, it is determined whether or not there is a capacitance decrease corresponding to 1LSB in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switch SWh is switched to the on state, the reference potential VREF is inputted to one end of the capacitor C128_127 under determination, and VREF×1/16 is inputted to one end of the capacitor C0. Based on the output of the comparator 11 at this time, it is determined whether or not there is a capacitance decrease corresponding to 1LSB in the capacitor C128_127.

In the same way, it is determined whether or not there is a capacitance decrease corresponding to 1LSB in each capacitance value of the MOS capacitors C128_126 to C1. Thus, the accuracy determination in the first stage and the second stage is performed on each MOS capacitor, thereby making it possible to confirm whether or not the accuracy of the capacitance value of each MOS capacitor falls within the range of ±1LSB.

Effect of First Embodiment

As described above, according to the AD converter 140 included in the semiconductor device according to the first embodiment, it is possible to self-diagnose whether or not the accuracy of the capacitance of each capacitor configuring the C-DAC 20 falls within the range of ±1LSB, which can enhance user convenience. Further, by adjusting the output of the R-DAC 30, it is possible to implement the self-healing function of correcting the output of a capacitor of degraded accuracy.

Second Embodiment

Figure 8:
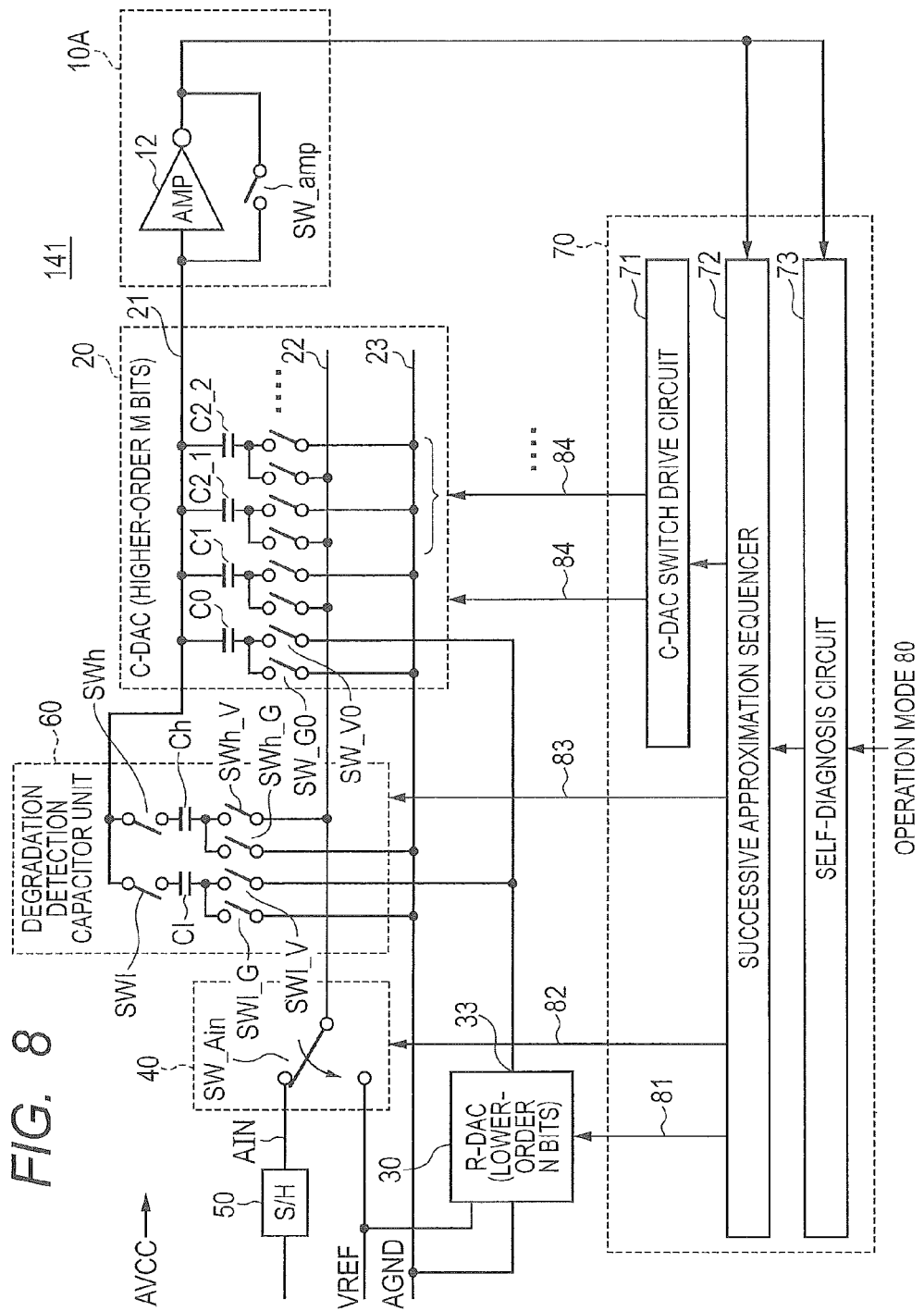
FIG. 8 is a block diagram showing the configuration of a successive approximation AD converter 141 provided in a semiconductor device according to a second embodiment.

FIG. 8 is a block diagram showing the configuration of a successive approximation AD converter 141 provided in a semiconductor device according to the second embodiment. The AD converter 141 of FIG. 8 differs from the AD converter 140 of FIG. 2 in that only the amplifier 12 and the switch SW_amp are provided in a comparison unit 10A and the comparator 11 and the switch SW_cmp are not provided. The AD converter 141 of FIG. 8 differs from the AD converter 140 of FIG. 2 in that one end of each of the MOS capacitors Ch and Cl configuring the degradation detection capacitor unit 60 is coupled through the corresponding switches SWh and SWl to the signal output line 21.

Since the other parts in FIG. 8 are the same as in FIG. 2, the same or equivalent parts are denoted by the same reference numerals, and their description will not be repeated. Further, the operation in the normal mode of the AD converter 141 is the same as that of the AD converter 140 according to the first embodiment, and the description thereof will not be repeated.

The operation in the test mode is divided into the first stage and the second stage. In the first stage, first, VREF×(1/16), i.e., the potential corresponding to 1LSB is inputted to one end of the capacitor C1 configuring the degradation detection capacitor unit 60, and the reference potential VREF is inputted to one end of the capacitor Ch. The ground potential AGND is inputted to one end of each of the other MOS capacitors. At this time, the switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, the reference potential VREF is inputted to one end of the MOS capacitor under test, and the ground potential AGND is inputted to one end of each of the other MOS capacitors (including Cl and Ch). Based on the output of the amplifier 12 at this time, it is determined whether or not there is a capacitance increase corresponding to 1LSB in the MOS capacitor under test.

In the second stage in the test mode, first, the reference potential VREF is inputted to one end of the capacitor Ch configuring the degradation detection capacitor unit 60, and the ground potential AGND is inputted to one end of each of the other MOS capacitors (including Cl). At this time, the switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, the reference potential VREF is inputted to one end of the MOS capacitor under test, the reference potential VREF×(1/16) is inputted to one end of the capacitor C1 configuring the degradation detection capacitor unit 60, and the ground potential AGND is inputted to one end of each of the other MOS capacitors (including Ch). Based on the output of the amplifier 12 at this time, it is determined whether or not there is a capacitance decrease corresponding to 1LSB in the MOS capacitor under test. Hereinafter, specific description will be made with reference to drawings.

Figure 9:
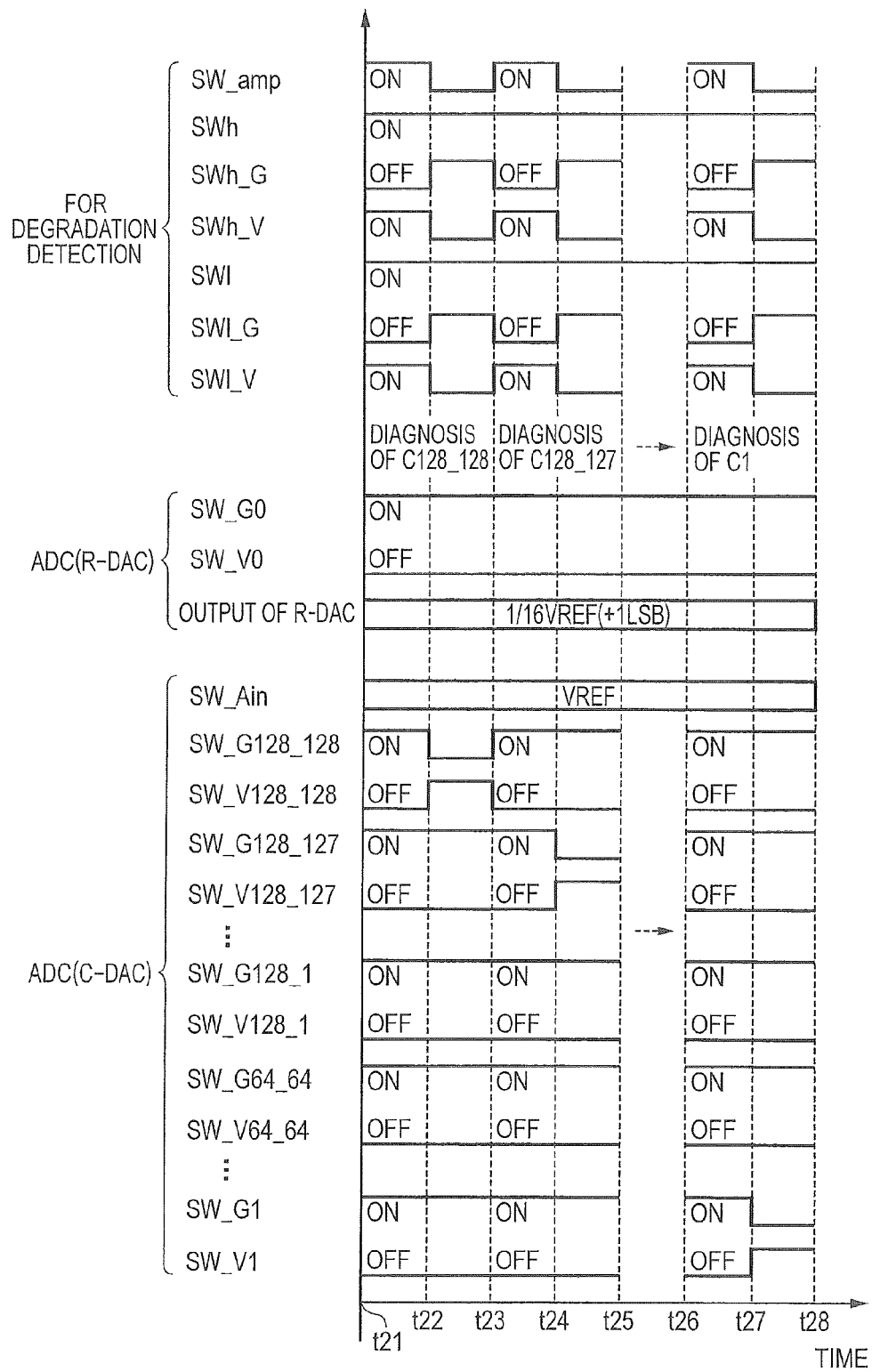
FIG. 9 is a timing chart for explaining the operation in the test mode (first stage) of the AD converter 141 in FIG. 8.

FIG. 9 is a timing chart for explaining the operation in the test mode (first stage) of the AD converter 141 in FIG. 8. Referring to FIGS. 3, 8, and 9, in the test mode (first stage), from the MOS capacitor C128_128 to the MOS capacitor C1, the accuracy of the capacitance value of each capacitor is determined individually in order. In the first stage, the switches SWl and SWh are fixed to the on state. The switch SW_G0 coupled to the capacitor C0 is fixed to the on state, and the switch SW_V0 is fixed to the off state. The output of the R-DAC is fixed to VREF×(1/16), i.e., the voltage corresponding to 1LSB. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, VREF×(1/16) is inputted to one end of the capacitor C1 in the degradation detection capacitor unit 60 by switching the corresponding switches SWl_V, SWl_G. The reference potential VREF is inputted to one end of the capacitor Ch by switching the corresponding switches SWh_V, SWh_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. The ground potential AGND is inputted to one end of each of the capacitors Cl and Ch in the degradation detection capacitor unit 60 by switching the corresponding switches. Further, in order that the reference potential VREF is inputted to one end of the capacitor C128_128 under determination, the corresponding switches are switched. Based on the output of the amplifier 12 at this time, it is determined whether or not there is a capacitance increase corresponding to 1LSB in the capacitor C128_128.

Then, between times t23 and t25, the accuracy of the capacitance value of the MOS capacitor C128_127 is determined. More specifically, between times t23 and t24 as between times t21 and t22, VREF×(1/16) is inputted to one end of the capacitor C1 in the degradation detection capacitor unit 60, VREF is inputted to one end of the capacitor Ch, and the ground potential AGND is inputted to one end of each of the other MOS capacitors. The switch SW_amp is turned on; accordingly, the potential of the signal output line 21 is set to the intermediate reference potential between the reference potential VREF and the ground potential AGND. Then, between times t24 and t25, the switch SW_amp is switched to the off state, the reference potential VREF is inputted to one end of the capacitor C128_127 under determination, and the ground potential AGND is inputted to one end of each of the other MOS capacitors (including Cl and Ch). Based on the output of the amplifier 12 at this time, it is determined whether or not there is a capacitance increase corresponding to 1LSB in the capacitor C128_127.

In the same way, it is determined whether or not there is a capacitance increase corresponding to 1LSB in each capacitance value of the MOS capacitors C128_126 to C1.

Figure 10:
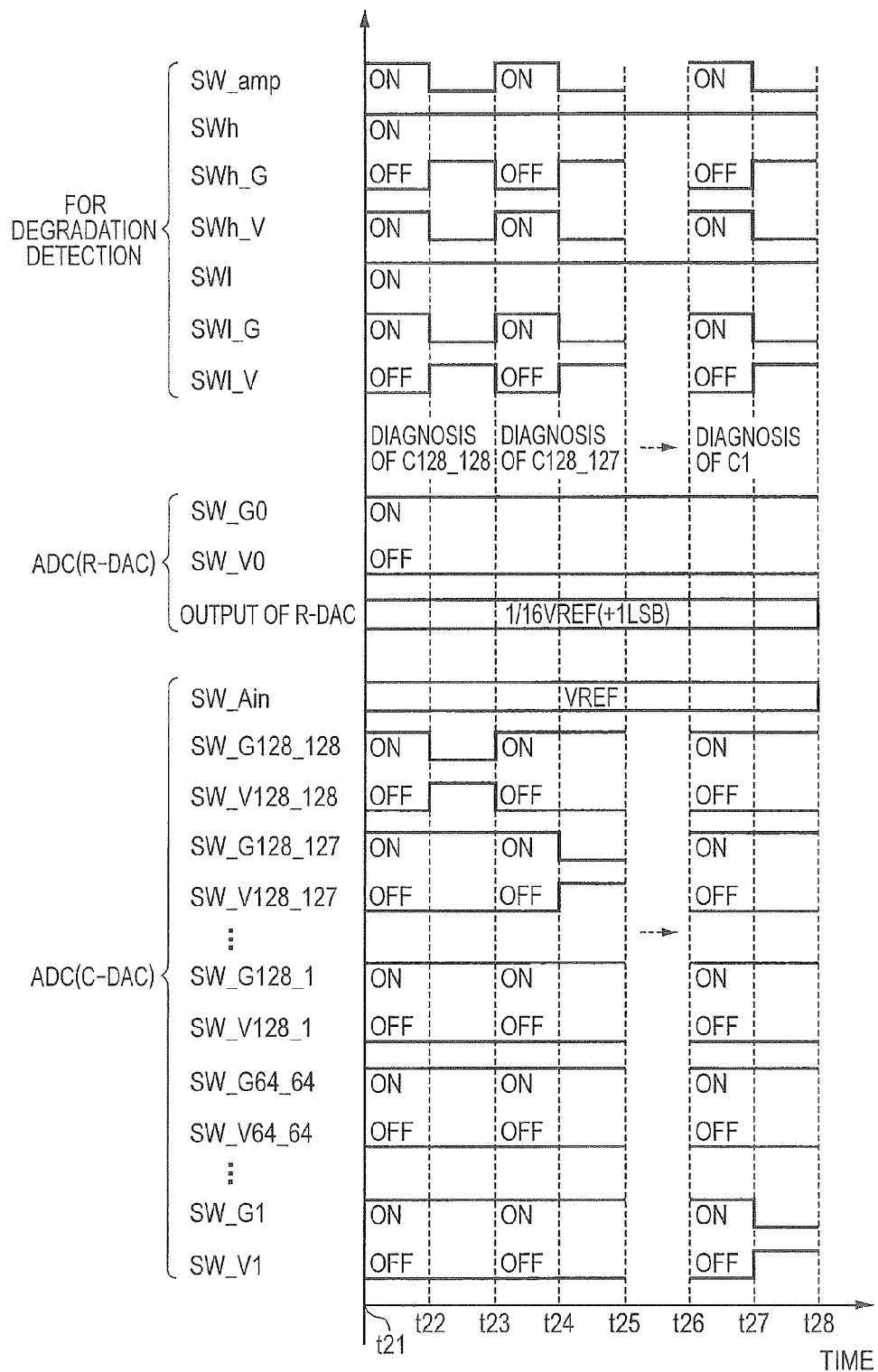
FIG. 10 is a timing chart for explaining the operation in the test mode (second stage) of the AD converter 141 in FIG. 8.

FIG. 10 is a timing chart for explaining the operation in the test mode (second stage) of the AD converter 141 in FIG. 8. Referring to FIGS. 3, 8, and 10, in the second stage as well, from the MOS capacitor C128_128 to the MOS capacitor C1, the accuracy of the capacitance value of each capacitor is determined individually in order. The switches SWl and SWh are fixed to the on state. The switch SW_G0 coupled to the capacitor C0 is fixed to the on state, and the switch SW_V0 is fixed to the off state. The output of the R-DAC is fixed to VREF×(1/16), i.e., the voltage corresponding to 1LSB. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the ground potential AGND is inputted to one end of the capacitor C1 in the degradation detection capacitor unit 60 by switching the corresponding switches SWl_V, SWl_G. The reference potential VREF is inputted to one end of the capacitor Ch by switching the corresponding switches SWh_V, SWh_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. VREF×(1/16) is inputted to one end of the capacitor C1 in the degradation detection capacitor unit 60 by switching the corresponding switches SW1_V, SW1_G. The ground potential AGND is inputted to one end of the capacitor Ch by switching the corresponding switches SWh_V, SWh_G. Further, in order that the reference potential VREF is inputted to one end of the capacitor C128_128 under determination, the corresponding switches are switched. Based on the output of the amplifier 12 at this time, it is determined whether or not there is a capacitance decrease corresponding to 1LSB in the capacitor C128_128.

Then, between times t23 and t25, the accuracy of the capacitance value of the MOS capacitor C128_127 is determined. More specifically, between times t23 and t24 as between times t21 and t22, the ground potential AGND is inputted to one end of the capacitor C1, VREF is inputted to one end of the capacitor Ch, and the ground potential AGND is inputted to one end of each of the other MOS capacitors. Further, the switch SW_amp is turned on; accordingly, the potential of the signal output line 21 is set to the intermediate reference potential between the reference potential VREF and the ground potential AGND. Then, between times t24 and t25, the switch SW_amp is switched to the off state, the reference potential VREF is inputted to one end of the capacitor C128_127 under determination, VREF×(1/16) is inputted to one end of the capacitor C1, and the ground potential AGND is inputted to one end of each of the other MOS capacitors (including Ch). Based on the output of the amplifier 12 at this time, it is determined whether or not there is a capacitance decrease corresponding to 1LSB in the capacitor C128_127.

In the same way, it is determined whether or not there is a capacitance decrease corresponding to 1LSB in each capacitance value of the MOS capacitors C128_126 to C1. Thus, the accuracy determination in the first stage and the second stage is performed on each MOS capacitor, thereby making it possible to confirm whether or not the accuracy of the capacitance value of each MOS capacitor falls within the range of ±1LSB.

As described above, according to the AD converter 141 included in the semiconductor device according to the second embodiment, it is possible to self-diagnose whether or not the accuracy of the capacitance of each capacitor configuring the C-DAC 20 falls within the range of ±1LSB, which can enhance user convenience. Further, by adjusting the output of the R-DAC 30, it is possible to implement the self-healing function of correcting the output of a capacitor of degraded accuracy.

Third Embodiment

Figure 11:
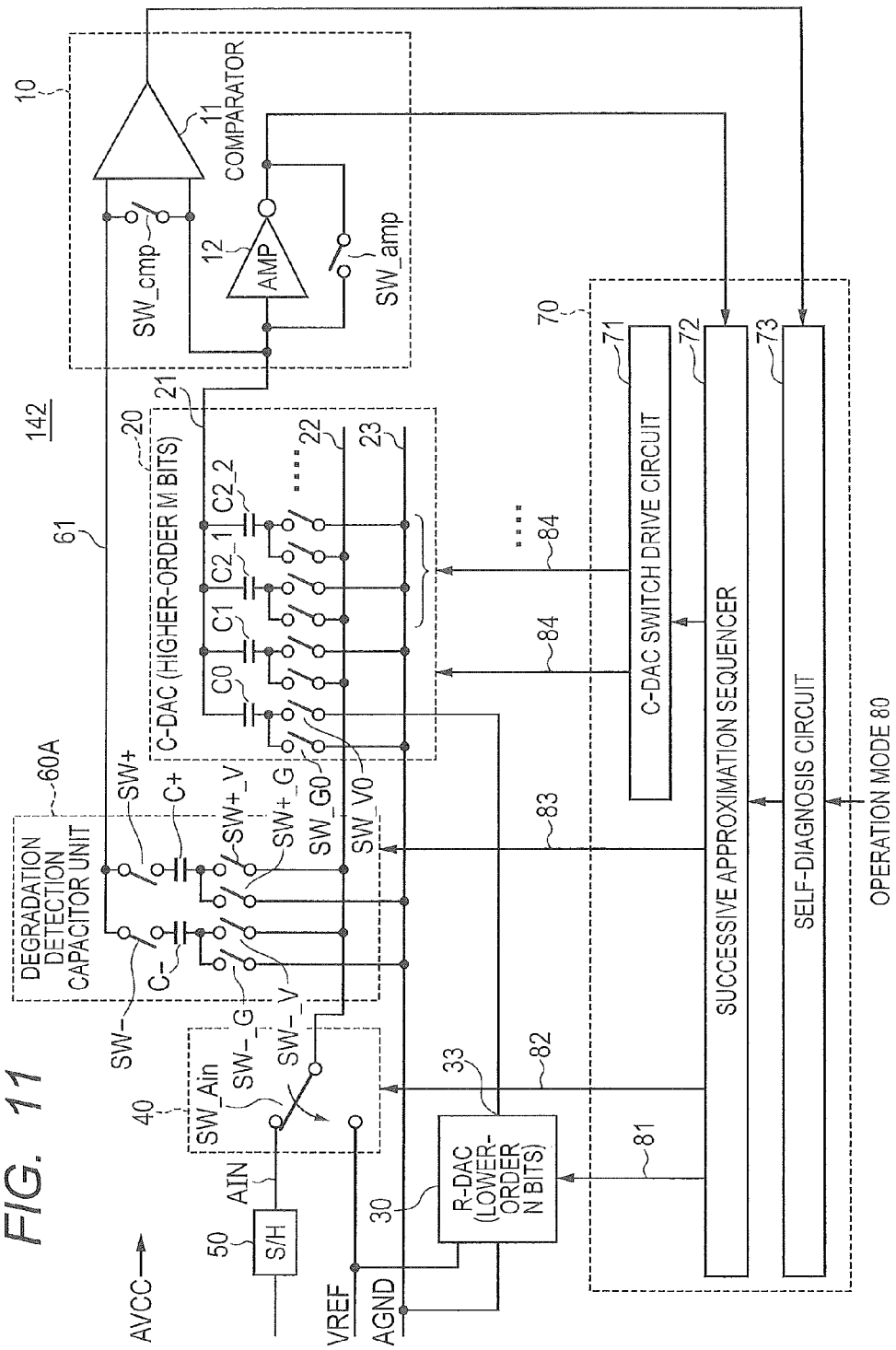
FIG. 11 is a block diagram showing the configuration of a successive approximation AD converter 142 provided in a semiconductor device according to a third embodiment.

FIG. 11 is a block diagram showing the configuration of a successive approximation AD converter 142 provided in a semiconductor device according to the third embodiment. The AD converter 142 of FIG. 11 differs from the AD converter 140 of FIG. 2 in that capacitors C+ and C− instead of the MOS capacitors Ch and Cl are provided in a degradation detection capacitor unit 60A. The capacitance value of the capacitor C+ is larger than that of each capacitor provided in the C-DAC 20 by ΔC. The capacitance value of the capacitor C− is smaller than that of each capacitor provided in the C-DAC 20 by ΔC. The capacitance value difference ΔC is set equal to or less than 1LSB.

As shown in FIG. 11, the degradation detection capacitor unit 60A includes the MOS capacitors C−, C+, and switches SW−, SW−_G, SW−_V, SW+, SW+_G, SW+_V. One end of the MOS capacitor C− is coupled through the switch SW− to the voltage line 61, and coupled through the voltage line 61 to the other input node (different side from the signal output line 21) of the comparator 11. The other end of the MOS capacitor C− is coupled through the switches SW−_G and SW−_V to the ground line 23 and the voltage line 22 respectively. One end of the MOS capacitor C+ is coupled through the switch SW+ to the voltage line 61. The other end of the MOS capacitor C+ is coupled through the switches SW+_G and SW+_V to the ground line 23 and the voltage line 22 respectively.

Since the other parts in FIG. 11 are the same as in FIG. 2, the same or equivalent parts are denoted by the same reference numerals, and their description will not be repeated. Further, the operation in the normal mode of the AD converter 142 is the same as that of the AD converter 140 according to the first embodiment, and the description thereof will not be repeated.

The operation in the test mode is divided into the first stage and the second stage. More specifically, in the first stage, the reference potential VREF is inputted to one end of the capacitor C+ configuring the degradation detection capacitor unit 60A. The capacitor C− is decoupled from the circuits by the corresponding switches. The reference potential VREF is individually inputted to one end of each MOS capacitor configuring the groups C1 to C128 in the C-DAC 20. At this time, the potential of the signal output line 21 and the potential of the voltage line 61 are compared by the comparator 11. Thereby, it is determined whether or not there is a capacitance increase exceeding ΔC in each MOS capacitor. In the test mode, the amplifier 12 is in a non-operating state, and the switch SW_amp is turned off.

In the second stage, the reference potential VREF is inputted to one end of the capacitor C− configuring the degradation detection capacitor unit 60A. The capacitor C+ is decoupled from the circuits by the corresponding switches. The reference potential VREF is individually inputted to one end of each MOS capacitor configuring the groups C1 to C128 in the C-DAC 20. At this time, the potential of the signal output line 21 and the potential of the voltage line 61 are compared by the comparator 11. Thereby, it is determined whether or not there is a capacitance decrease exceeding ΔC in each MOS capacitor. Hereinafter, specific description will be made with reference to drawings.

Figure 12:
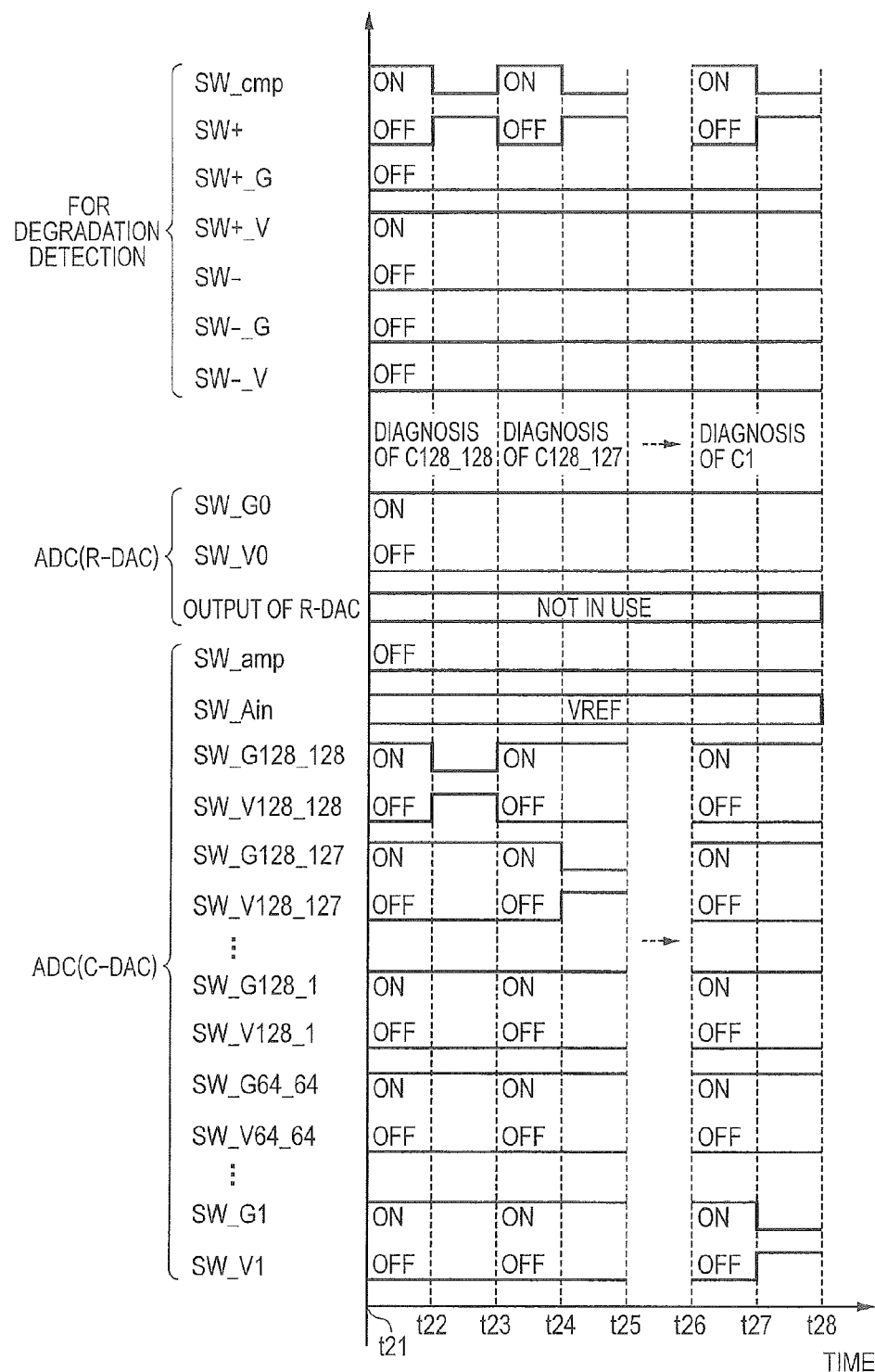
FIG. 12 is a timing chart for explaining the operation in the test mode (first stage) of the AD converter 142 in FIG. 11.

FIG. 12 is a timing chart for explaining the operation in the test mode (first stage) of the AD converter 142 in FIG. 11. Referring to FIGS. 3, 11, and 12, in the test mode (first stage), from the MOS capacitor C128_128 to the MOS capacitor C1, the accuracy of the capacitance value of each capacitor is determined individually in order. In the first stage, the switches SW−_G, SW−_V, and SW− are fixed to the off state. That is, the MOS capacitor C− is decoupled from the circuits. The switch SW+_G is fixed to the off state, and the switch SW+_V is fixed to the on state. The switch SW_G0 coupled to the capacitor C0 is fixed to the on state, and the switch SW_V0 is fixed to the off state. The R-DAC 30 is not used. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the switch SW+ in the degradation detection capacitor unit 60A is turned off; accordingly, the capacitor C+ is decoupled from the input node of the comparator 11. The ground potential AGND is inputted to one end of each capacitor configuring the groups C1 to C128 in the C-DAC 20. The switch SW_cmp on the input side of the comparator 11 is turned on; accordingly, the signal output line 21 and the voltage line 61 are set to the same potential. The intermediate potential between the reference potential VREF and the ground potential AGND occurs on the output of the comparator 11. Alternatively, a predetermined potential may be provided to the signal output line 21 and the voltage line 61.

Then, between times t22 and t23, the switch SW_cmp is switched to the off state. The switch SW+ in the degradation detection capacitor unit 60A is turned on; accordingly, the capacitor C+ is coupled to the input node of the comparator 11. Further, in order that the reference potential VREF is inputted to one end of the capacitor C128_128 under determination, the corresponding switches are switched. At this time, the potential of the signal output line 21 and the potential of the voltage line 61 are compared by the comparator 11. Thereby, it is determined whether or not there is a capacitance increase exceeding ΔC in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switch SW+ is switched to the on state, and the reference potential VREF is inputted to one end of the capacitor C128_127 under determination. Based on the output of the comparator 11 at this time, it is determined whether or not there is a capacitance increase exceeding ΔC in the capacitor C128_127.

In the same way, it is determined whether or not there is a capacitance increase exceeding ΔC in each capacitance value of the MOS capacitors C128_126 to C1.

Figure 13:
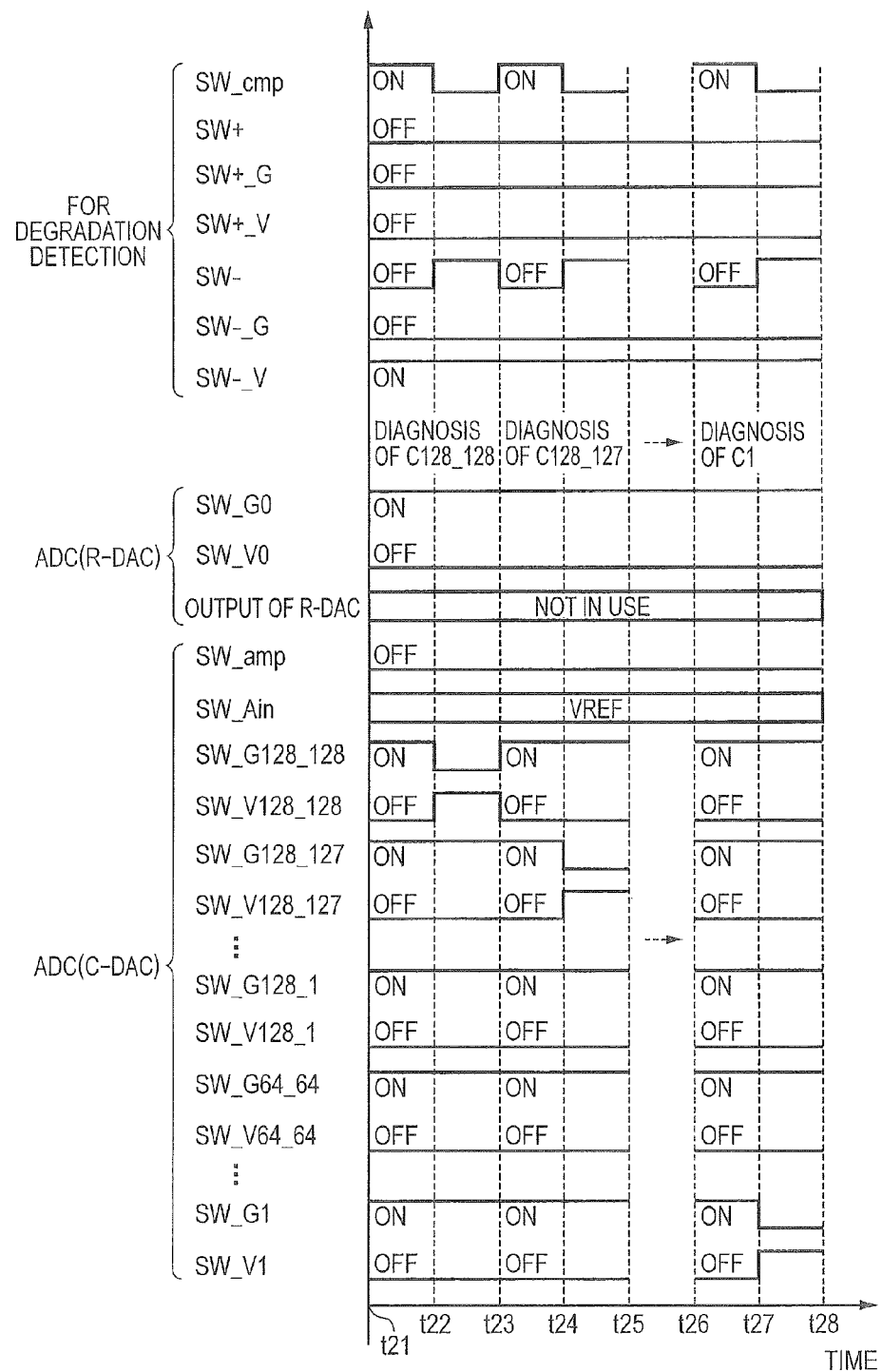
FIG. 13 is a timing chart for explaining the operation in the test mode (second stage) of the AD converter 142 in FIG. 11.

FIG. 13 is a timing chart for explaining the operation in the test mode (second stage) of the AD converter 142 in FIG. 11. Referring to FIGS. 3, 11, and 13, in the test mode (second stage), from the MOS capacitor C128_128 to the MOS capacitor C1, the accuracy of the capacitance value of each capacitor is determined individually in order. In the second stage, the switches SW+_G, SW+_V, and SW+ are fixed to the off state. That is, the MOS capacitor C+ is decoupled from the circuits. The switch SW−_G is fixed to the off state, and the switch SW−_V is fixed to the on state. The switch SW_G0 coupled to the capacitor C0 is fixed to the on state, and the switch SW_V0 is fixed to the off state. The R-DAC 30 is not used. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the switch SW− in the degradation detection capacitor unit 60A is turned off; accordingly, the capacitor C− is decoupled from the input node of the comparator 11. The ground potential AGND is inputted to one end of each capacitor configuring the groups C1 to C128 in the C-DAC 20. The switch SW_cmp on the input side of the comparator 11 is turned on; accordingly, the signal output line 21 and the voltage line 61 are set to the same potential. The intermediate potential between the reference potential VREF and the ground potential AGND occurs on the output of the comparator 11. Alternatively, a predetermined potential may be provided to the signal output line 21 and the voltage line 61.

Then, between times t22 and t23, the switch SW_cmp is switched to the off state. The switch SW− in the degradation detection capacitor unit 60A is turned on; accordingly, the capacitor C− is coupled to the input node of the comparator 11. Further, in order that the reference potential VREF is inputted to one end of the capacitor C128_128 under determination, the corresponding switches are switched. At this time, the potential of the signal output line 21 and the potential of the voltage line 61 are compared by the comparator 11. Thereby, it is determined whether or not there is a capacitance decrease exceeding ΔC in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switch SW− is switched to the on state, and the reference potential VREF is inputted to one end of the capacitor C128_127 under determination. Based on the output of the comparator 11 at this time, it is determined whether or not there is a capacitance decrease exceeding ΔC in the capacitor C128_127.

In the same way, it is determined whether or not there is a capacitance decrease exceeding ΔC in each capacitance value of the MOS capacitors C128_126 to C1.

As described above, according to the AD converter 142 included in the semiconductor device according to the third embodiment, it is possible to self-diagnose whether or not the accuracy of the capacitance of each capacitor configuring the C-DAC 20 falls within the range of ±ΔC (i.e., equal to or less than ±1LSB), which can enhance user convenience. Further, by adjusting the output of the R-DAC 30, it is possible to implement the self-healing function of correcting the output of a capacitor of degraded accuracy.

Fourth Embodiment

Figure 14:
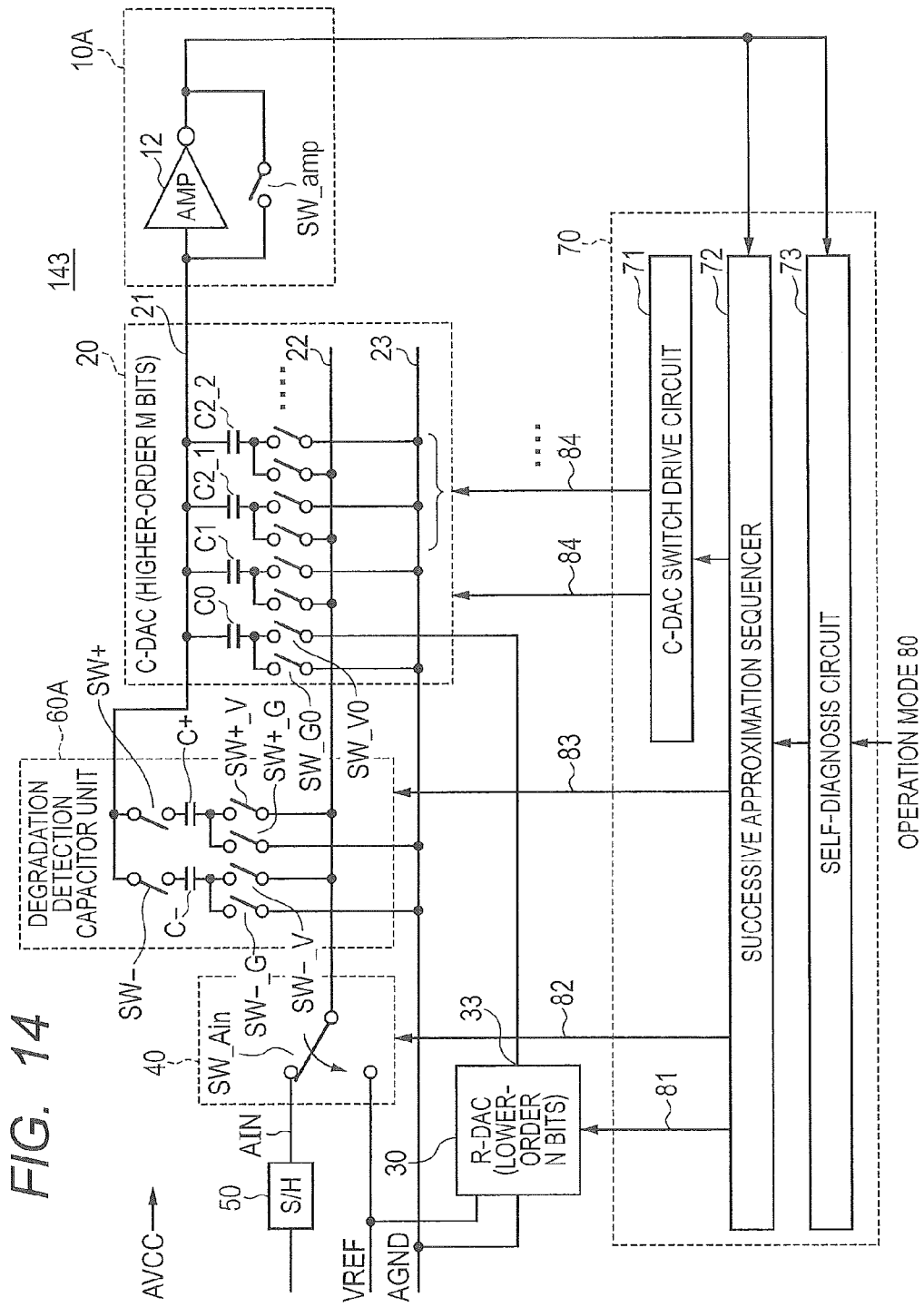
FIG. 14 is a block diagram showing the configuration of a successive approximation AD converter 143 provided in a semiconductor device according to a fourth embodiment.

FIG. 14 is a block diagram showing the configuration of a successive approximation AD converter 143 provided in a semiconductor device according to the fourth embodiment. The AD converter 143 of FIG. 14 differs from the AD converter 141 according to the second embodiment shown in FIG. 8 in that the capacitors C+ and C− instead of the MOS capacitors Ch and Cl are provided in the degradation detection capacitor unit 60A. The capacitance value of the capacitor C+ is larger than that of each capacitor provided in the C-DAC 20 by ΔC. The capacitance value of the capacitor C− is smaller than that of each capacitor provided in the C-DAC 20 by ΔC. The capacitance value difference ΔC is set equal to or less than 1LSB.

Since the configuration of the degradation detection capacitor unit 60A shown in FIG. 14 is the same as in FIG. 11, the description will not be repeated. Since the other parts in FIG. 14 are the same as in FIG. 8, the same or equivalent parts are denoted by the same reference numerals, and their description will not be repeated. Further, the operation in the normal mode of the AD converter 143 is the same as that of the AD converter 141 according to the second embodiment, and the description thereof will not be repeated.

The operation in the test mode is divided into the first stage and the second stage. More specifically, in the first stage, first, the reference potential VREF is inputted to one end of the capacitor C+ configuring the degradation detection capacitor unit 60A. The capacitor C− is decoupled from the circuits by the corresponding switches. The ground potential AGND is inputted to one end of each MOS capacitor configuring the C-DAC 20. At this time, the switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, the reference potential VREF is inputted to one end of the MOS capacitor under test, and the ground potential AGND is inputted to one end of each of the other MOS capacitors (including C+). Based on the output of the amplifier 12 at this time, it is determined whether or not there is a capacitance increase exceeding ΔC in the MOS capacitor under test.

In the second stage, first, the reference potential VREF is inputted to one end of the capacitor C– configuring the degradation detection capacitor unit 60A. The capacitor C+ is decoupled from the circuits by the corresponding switches. The ground potential AGND is inputted to one end of each MOS capacitor configuring the C-DAC 20. The switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, the reference potential VREF is inputted to one end of the MOS capacitor under test, and the ground potential AGND is inputted to one end of each of the other MOS capacitors (including C–). Based on the output of the amplifier 12 at this time, it is determined whether or not there is a capacitance decrease exceeding ΔC in the MOS capacitor under test. Hereinafter, specific description will be made with reference to drawings.

Figure 15:
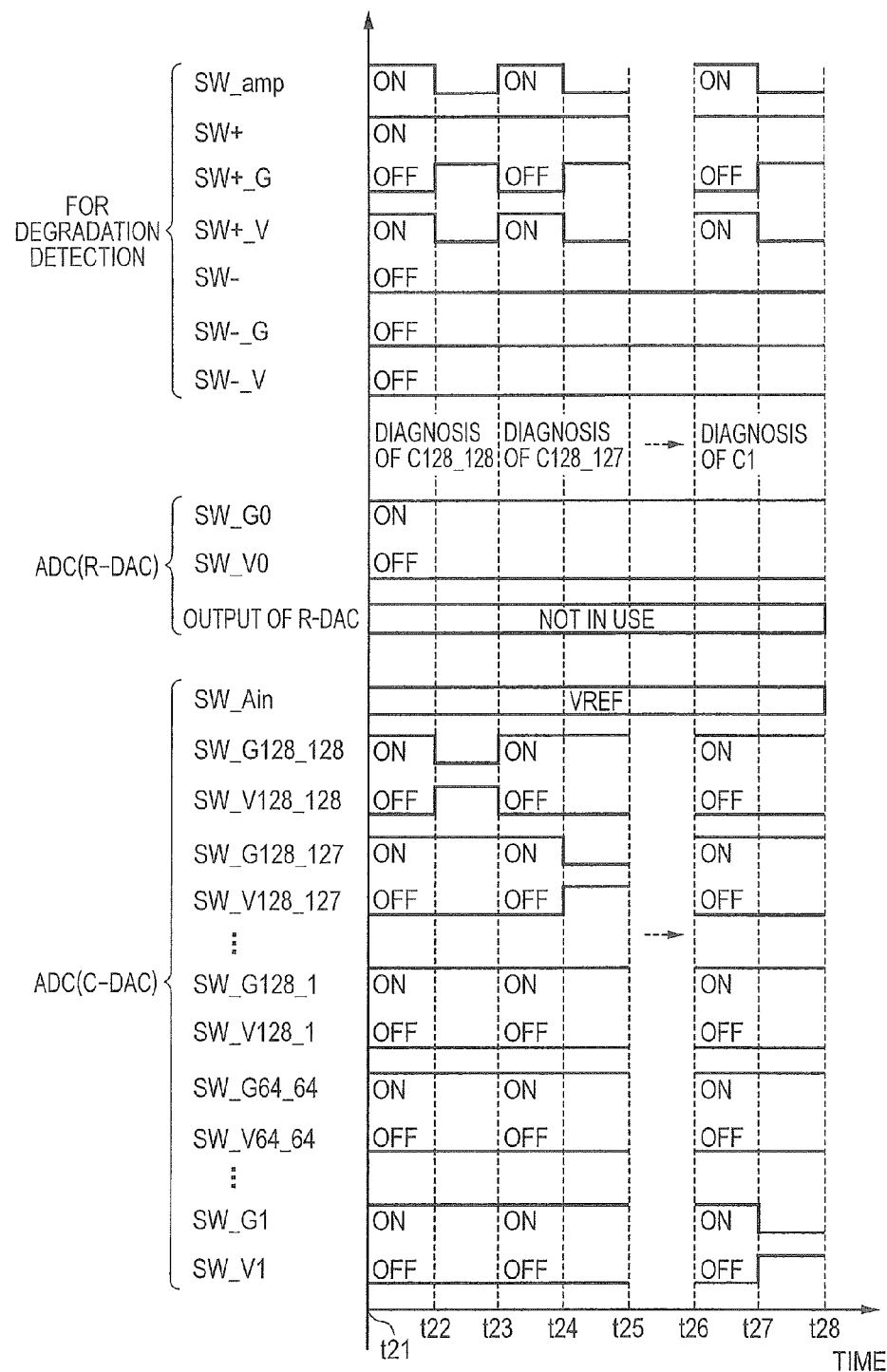
FIG. 15 is a timing chart for explaining the operation in the test mode (first stage) of the AD converter 143 in FIG. 14.

FIG. 15 is a timing chart for explaining the operation in the test mode (first stage) of the AD converter 143 in FIG. 14. Referring to FIGS. 3, 14, and 15, in the test mode (first stage), from the MOS capacitor C128_128 to the MOS capacitor C1, the accuracy of the capacitance value of each capacitor is determined individually in order. In the first stage, the switches SW–_G, SW–_V, and SW– are fixed to the off state. That is, the MOS capacitor C– is decoupled from the circuits. The switch SW+ is fixed to the on state. The switch SW_G0 coupled to the capacitor C0 is fixed to the on state, and the switch SW_V0 is fixed to the off state. The R-DAC 30 is not used. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the reference potential VREF is inputted to one end of the capacitor C+ in the degradation detection capacitor unit 60A by switching the corresponding switches SW–_EV, SW+_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. The ground potential AGND is inputted to one end of the capacitor C+ in the degradation detection capacitor unit 60A by switching the corresponding switches. Further, in order that the reference potential VREF is inputted to one end of the capacitor C128_128 under determination, the corresponding switches are switched. Based on the output of the amplifier 12 at this time, it is determined whether or not there is a capacitance increase exceeding ΔC in the capacitor C128_128.

Then, between times t23 and t25, the accuracy of the capacitance value of the MOS capacitor C128_127 is determined. More specifically, between times t23 and t24 as between times t21 and t22, VREF is inputted to one end of the capacitor C+ in the degradation detection capacitor unit 60A, and the ground potential AGND is inputted to one end of each of the other MOS capacitors. The switch SW_amp is turned on; accordingly, the potential of the signal output line 21 is set to the intermediate reference potential between the reference potential VREF and the ground potential AGND. Then, between times t24 and t25, the switch SW_amp is switched to the off state, the reference potential VREF is inputted to one end of the capacitor C128_127 under determination, and the ground potential AGND is inputted to one end of each of the other MOS capacitors (including C+). Based on the output of the amplifier 12 at this time, it is determined whether or not there is a capacitance increase exceeding ΔC in the capacitor C128_127.

In the same way, it is determined whether or not there is a capacitance increase exceeding ΔC in each capacitance value of the MOS capacitors C128_126 to C1.

Figure 16:
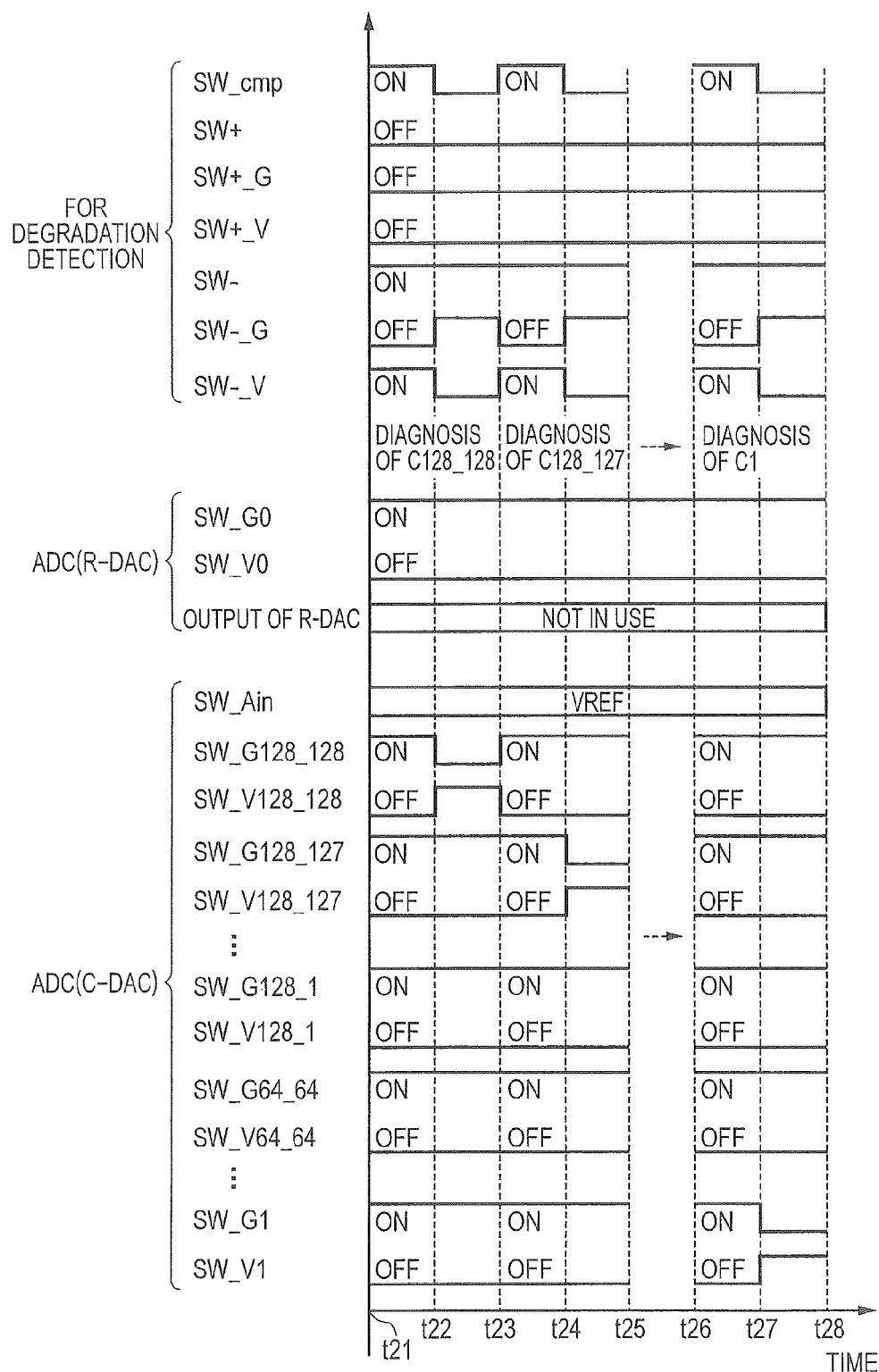
FIG. 16 is a timing chart for explaining the operation in the test mode (second stage) of the AD converter 143 in FIG. 14.

FIG. 16 is a timing chart for explaining the operation in the test mode (second stage) of the AD converter 143 in FIG. 14. Referring to FIGS. 3, 14, and 16, in the test mode (second stage), from the MOS capacitor C128_128 to the MOS capacitor C1, the accuracy of the capacitance value of each capacitor is determined individually in order. In the second stage, the switches SW+_G, SW+_V, and SW+ are fixed to the off state. That is, the MOS capacitor C+ is decoupled from the circuits. The switch SW– is fixed to the on state. The switch SW_G0 coupled to the capacitor C0 is fixed to the on state, and the switch SW_V0 is fixed to the off state. The R-DAC 30 is not used. The input side of the switch SW_Ain of the input signal switching unit 40 is fixed to the reference potential VREF.

First, between times t21 and t23, the accuracy of the capacitance value of the capacitor C128_128 is determined. More specifically, between times t21 and t22, the reference potential VREF is inputted to one end of the capacitor C– in the degradation detection capacitor unit 60A by switching the corresponding switches SW–_V, SW–_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. The ground potential AGND is inputted to one end of the capacitor C– in the degradation detection capacitor unit 60A by switching the corresponding switches. Further, in order that the reference potential VREF is inputted to one end of the capacitor C128_128 under determination, the corresponding switches are switched. Based on the output of the amplifier 12 at this time, it is determined whether or not there is a capacitance decrease exceeding ΔC in the capacitor C128_128.

Then, between times t23 and t25, the accuracy of the capacitance value of the MOS capacitor C128_127 is determined. More specifically, between times t23 and t24 as between times t21 and t22, VREF is inputted to one end of the capacitor C– in the degradation detection capacitor unit 60A, and the ground potential AGND is inputted to one end of each of the other MOS capacitors. The switch SW_amp is turned on; accordingly, the potential of the signal output line 21 is set to the intermediate reference potential between the reference potential VREF and the ground potential AGND. Then, between times t24 and t25, the switch SW_amp is switched to the off state, the reference potential VREF is inputted to one end of the capacitor C128_127 under determination, and the ground potential AGND is inputted to one end of each of the other MOS capacitors (including C−). Based on the output of the amplifier 12 at this time, it is determined whether or not there is a capacitance decrease exceeding ΔC in the capacitor C128_127.

In the same way, it is determined whether or not there is a capacitance decrease exceeding ΔC in each capacitance value of the MOS capacitors C128_126 to C1.

As described above, according to the AD converter 143 included in the semiconductor device according to the fourth embodiment, it is possible to self-diagnose whether or not the accuracy of the capacitance of each capacitor configuring the C-DAC 20 falls within the range of ±ΔC (i.e., equal to or less than ±1LSB), which can enhance user convenience. Further, by adjusting the output of the R-DAC 30, it is possible to implement the self-healing function of correcting the output of a capacitor of degraded accuracy.

Fifth Embodiment

Figure 17:
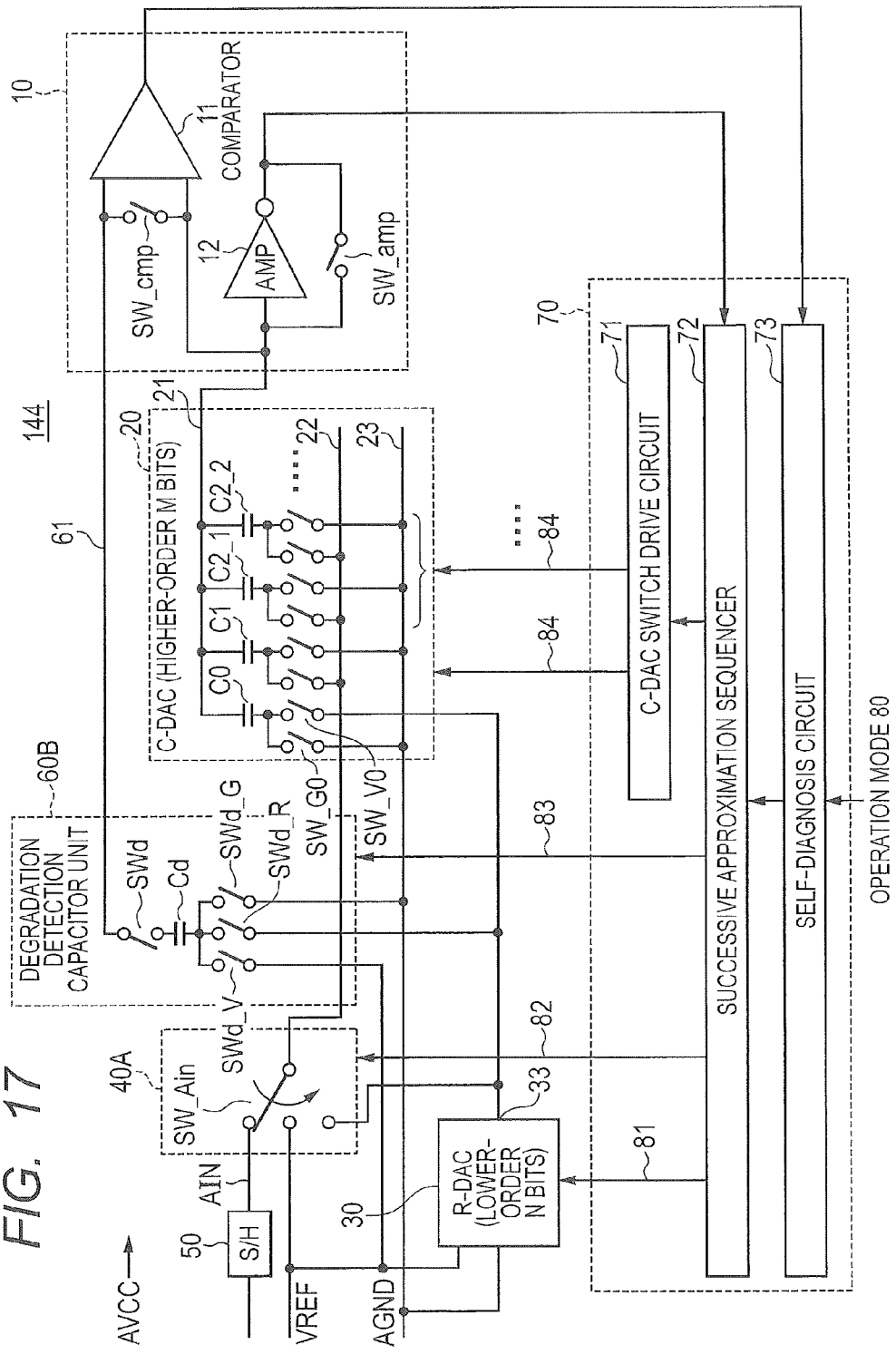
FIG. 17 is a block diagram showing the configuration of a successive approximation AD converter 144 provided in a semiconductor device according to a fifth embodiment.

FIG. 17 is a block diagram showing the configuration of a successive approximation AD converter 144 provided in a semiconductor device according to the fifth embodiment. The AD converter 144 of FIG. 17 differs from the AD converter 140 of FIG. 2 in that a single capacitor Cd instead of the MOS capacitors Ch and Cl is provided in a degradation detection capacitor unit 60B. The capacitor Cd is designed and produced so as to have the same capacitance value as the capacitors provided in the C-DAC 20.

As shown in FIG. 17, the degradation detection capacitor unit 60B includes the MOS capacitor Cd and switches SWd, SWd_G, SWd_V, SWd_R. One end of the MOS capacitor Cd is coupled through the switch SWd to the voltage line 61, and coupled through the voltage line 61 to the other input node (different side from the signal output line 21) of the comparator 11. The other end of the MOS capacitor Cd is coupled through the switch SWd_G to the ground line 23, through the switch SWd_V to the reference potential VREF, and through the switch SWd_R to the output node 33 of the R-DAC 30.

Further, the AD converter 144 of FIG. 17 differs from the AD converter 140 of FIG. 2 in that the switch SW_Ain provided in an input signal switching unit 40A is changed to 3-input/1-output (identified as 1-input/3-output because the signal can be transmitted bidirectionally). The analog input signal Ain is inputted through the sample hold circuit 50 to the first input node of the switch SW_Ain. The reference potential VREF is inputted to the second input node of the switch SW_Ain. The output voltage of the R-DAC 30 is inputted to the third input node of the switch SW_Ain. The output node of the switch SW_Ain is coupled to the voltage line 22.

Since the other parts in FIG. 17 are the same as in FIG. 2, the same or equivalent parts are denoted by the same reference numerals, and their description will not be repeated. Further, the operation in the normal mode of the AD converter 144 is the same as that of the AD converter 140 according to the first embodiment, and the description thereof will not be repeated.

The operation in the test mode is divided into the first stage and the second stage. More specifically, in the first stage, the reference potential VREF is inputted through the switch SWd_V to one end of the capacitor Cd configuring the degradation detection capacitor unit 60B. VREF×(15/16) outputted from the R-DAC 30 is individually inputted to one end of each MOS capacitor configuring the groups C1 to C128 in the C-DAC 20. At this time, the potential of the signal output line 21 and the potential of the voltage line 61 are compared by the comparator 11. Thereby, it is determined whether or not there is a capacitance increase corresponding to 1LSB in each MOS capacitor. In the test mode, the amplifier 12 is in a non-operating state, and the switch SW_amp is turned off.

In the second stage, VREF×(15/16) is inputted through the switch SWd_R to one end of the capacitor Cd configuring the degradation detection capacitor unit 60B. The reference potential VREF is individually inputted to one end of each MOS capacitor configuring the groups C1 to C128 in the C-DAC 20. At this time, the potential of the signal output line 21 and the potential of the voltage line 61 are compared by the comparator 11. Thereby, it is determined whether or not there is a capacitance decrease corresponding to 1LSB in each MOS capacitor. Hereinafter, specific description will be made with reference to drawings.

Figure 18:
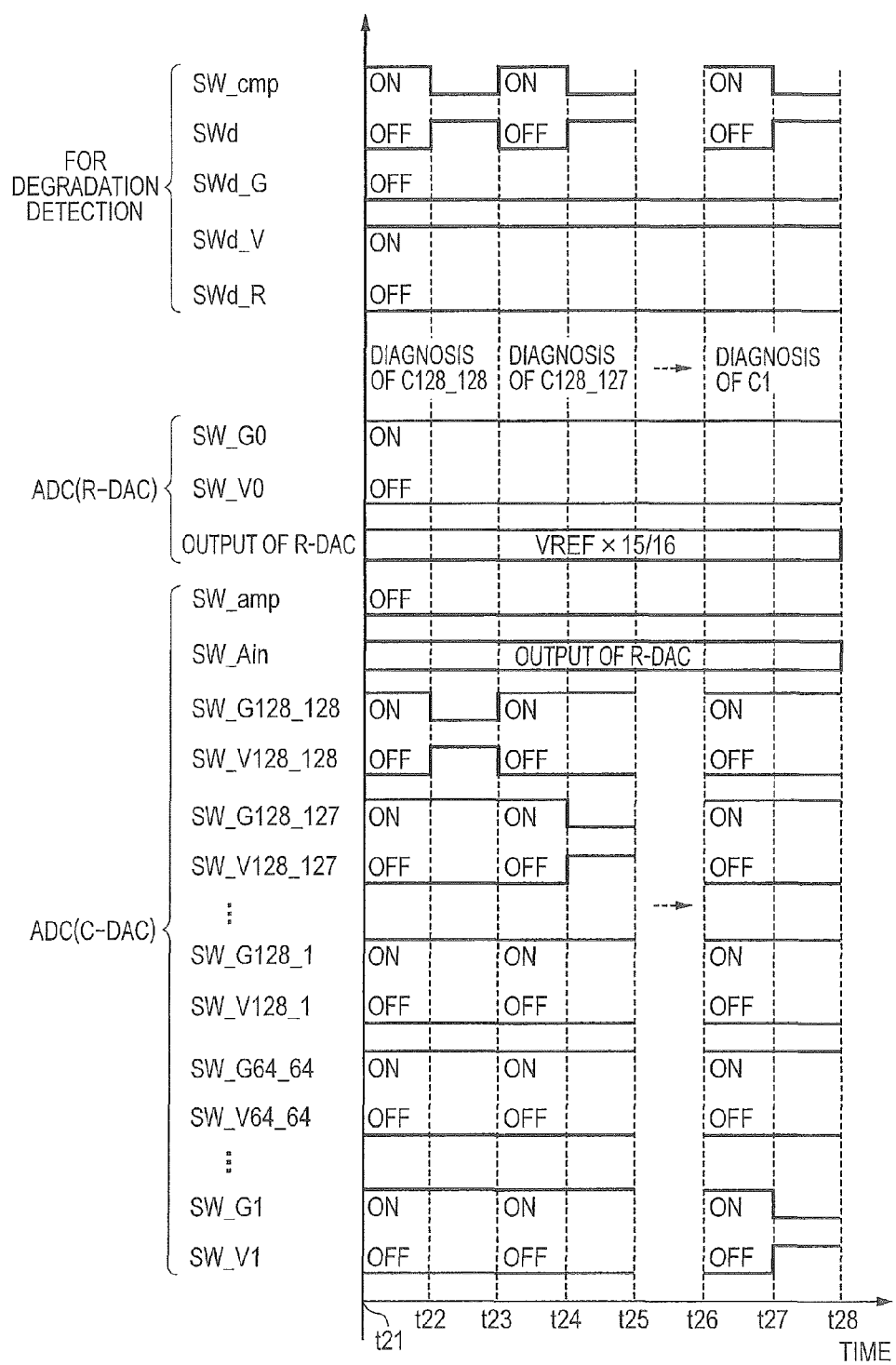
FIG. 18 is a timing chart for explaining the operation in the test mode (first stage) of the AD converter 144 in FIG. 17.

FIG. 18 is a timing chart for explaining the operation in the test mode (first stage) of the AD converter 144 in FIG. 17. Referring to FIGS. 3, 17, and 18, in the test mode (first stage), from the MOS capacitor C128_128 to the MOS capacitor C1, the accuracy of the capacitance value of each capacitor is determined individually in order. In the first stage, the switches SWd_G and SWd_R are fixed to the off state. The switch SWd_V is fixed to the on state. Thereby, the reference potential VREF is inputted to one end of the capacitor Cd in the degradation detection capacitor unit 60B. The switch SW_G0 coupled to the capacitor C0 is fixed to the on state, and the switch SW_V0 is fixed to the off state. The potential of VREF×(15/16) is outputted from the R-DAC 30. The input side of the switch SW_Ain of the input signal switching unit 40A is fixed to the output of the R-DAC 30.

First, between times t21 and t23, the accuracy of the capacitance value of the capacitor C128_128 is determined. More specifically, between times t21 and t22, the switch SWd in the degradation detection capacitor unit 60B is turned off; accordingly, the capacitor Cd is decoupled from the input node of the comparator 11. The ground potential AGND is inputted to one end of each capacitor configuring the groups C1 to C128 in the C-DAC 20. The switch SW_cmp on the input side of the comparator 11 is turned on; accordingly, the signal output line 21 and the voltage line 61 are set to the same potential. The intermediate potential between the reference potential VREF and the ground potential AGND occurs on the output of the comparator 11. Alternatively, a predetermined potential may be provided to the signal output line 21 and the voltage line 61.

Then, between times t22 and t23, the switch SW_cmp is switched to the off state. The switch SWd in the degradation detection capacitor unit 60B is turned on; accordingly, the capacitor Cd is coupled to the input node of the comparator 11. Further, in order that VREF×(15/16) is inputted to one end of the capacitor C128_128 under determination, the corresponding switches SW_G128_128, SW_V128_128 are switched. At this time, the potential of the signal output line 21 and the potential of the voltage line 61 are compared by the comparator 11. Thereby, it is determined whether or not there is a capacitance increase corresponding to 1LSB in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switch SWd is switched to the on state, and VREF×(15/16) is inputted to one end of the capacitor C128_127 under determination. Based on the output of the comparator 11 at this time, it is determined whether or not there is a capacitance increase corresponding to 1LSB in the capacitor C128_127.

In the same way, it is determined whether or not there is a capacitance increase corresponding to 1LSB in each capacitance value of the MOS capacitors C128_126 to C1.

Figure 19:
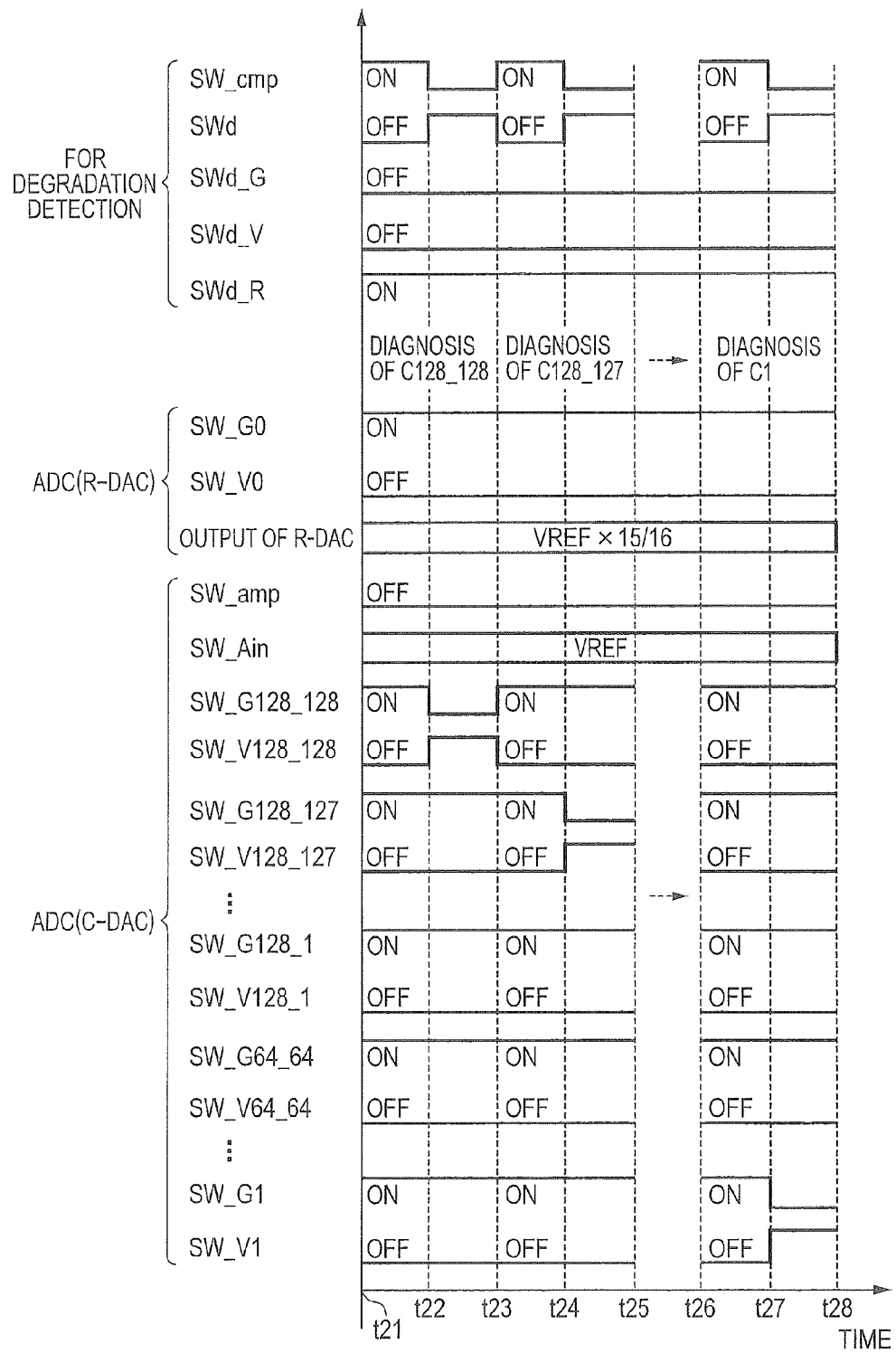
FIG. 19 is a timing chart for explaining the operation in the test mode (second stage) of the AD converter 144 in FIG. 17.

FIG. 19 is a timing chart for explaining the operation in the test mode (second stage) of the AD converter 144 in FIG. 17. Referring to FIGS. 3, 17, and 19, in the test mode (second stage), from the MOS capacitor C128_128 to the MOS capacitor C1, the accuracy of the capacitance value of each capacitor is determined individually in order. In the second stage, the switches SWd_G and SWd_V are fixed to the off state. The switch SWd_R is fixed to the on state. Thereby, one end of the capacitor Cd in the degradation detection capacitor unit 60B is coupled to the output node 33 of the R-DAC 30. The switch SW_G0 coupled to the capacitor C0 is fixed to the on state, and the switch SW_V0 is fixed to the off state. The potential of VREF×(15/16) is outputted from the R-DAC 30. The input side of the switch SW_Ain of the input signal switching unit 40A is fixed to the reference potential VREF.

First, between times t21 and t23, the accuracy of the capacitance value of the capacitor C128_128 is determined. More specifically, between times t21 and t22, the switch SWd in the degradation detection capacitor unit 60B is turned off; accordingly, the capacitor Cd is decoupled from the input node of the comparator 11. The ground potential AGND is inputted to one end of each capacitor configuring the groups C1 to C128 in the C-DAC 20. The switch SW_cmp on the input side of the comparator 11 is turned on; accordingly, the signal output line 21 and the voltage line 61 are set to the same potential. The intermediate potential between the reference potential VREF and the ground potential AGND occurs on the output of the comparator 11. Alternatively, a predetermined potential may be provided to the signal output line 21 and the voltage line 61.

Then, between times t22 and t23, the switch SW_cmp is switched to the off state. The switch SWd in the degradation detection capacitor unit 60B is turned on; accordingly, the capacitor Cd is coupled to the input node of the comparator 11. Further, in order that the reference potential VREF is inputted to one end of the capacitor C128_128 under determination, the corresponding switches SW_G128_128, SW_V128_128 are switched. At this time, the potential of the signal output line 21 and the potential of the voltage line 61 are compared by the comparator 11. Thereby, it is determined whether or not there is a capacitance decrease corresponding to 1LSB in the capacitor C128_128.

Then, between times t23 and t25, the accuracy of the capacitance value of the MOS capacitor C128_127 is determined. More specifically, between times t23 and t24 as between times t21 and t22, the signal output line 21 and the voltage line 61 are set to the same potential, and the output of the comparator 11 is set to the intermediate potential between the reference potential VREF and the ground potential AGND. Then, between times t24 and t25, the switch SW_cmp is switched to the off state, the switch SWd is switched to the on state, and the reference potential VREF is inputted to one end of the capacitor C128_127 under determination. Based on the output of the comparator 11 at this time, it is determined whether or not there is a capacitance decrease corresponding to 1LSB in the capacitor C128_127.

In the same way, it is determined whether or not there is a capacitance decrease corresponding to 1LSB in each capacitance value of the MOS capacitors C128_126 to C1.

As described above, according to the AD converter 144 included in the semiconductor device according to the fifth embodiment, it is possible to self-diagnose whether or not the accuracy of the capacitance of each capacitor configuring the C-DAC 20 falls within the range of ±1LSB, which can enhance user convenience. Further, by adjusting the output of the R-DAC 30, it is possible to implement the self-healing function of correcting the output of a capacitor of degraded accuracy.

Sixth Embodiment

Figure 20:
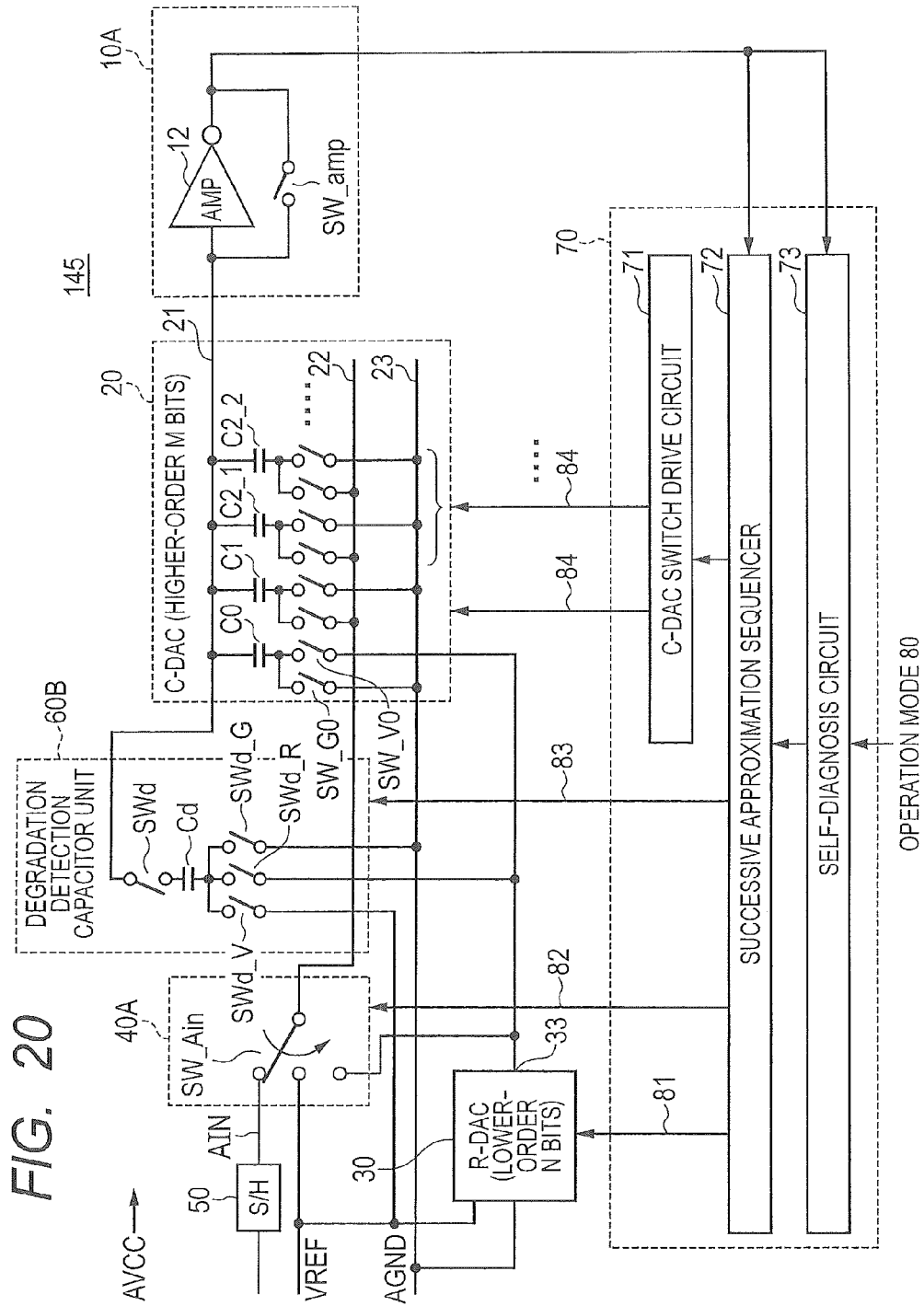
FIG. 20 is a block diagram showing the configuration of a successive approximation AD converter 145 provided in a semiconductor device according to a sixth embodiment.

FIG. 20 is a block diagram showing the configuration of a successive approximation AD converter 145 provided in a semiconductor device according to the sixth embodiment. The AD converter 145 of FIG. 20 differs from the AD converter 141 of FIG. 8 in that the single capacitor Cd instead of the MOS capacitors Ch and Cl is provided in the degradation detection capacitor unit 60B. The capacitor Cd is designed and produced so as to have the same capacitance value as the capacitors provided in the C-DAC 20.

As shown in FIG. 20, the degradation detection capacitor unit 60B includes the MOS capacitor Cd and the switches SWd, SWd_G, SWd_V, SWd_R. Since the coupling of these components is the same as in FIG. 17, the description will not be repeated.

Further, the AD converter 145 of FIG. 20 differs in the configuration of the switch SW_Ain provided in an input signal switching unit 40A. Since the configuration of the switch SW_Ain is the same as in FIG. 17, the description will not be repeated. Since the other parts in FIG. 20 are the same as in FIG. 8, the same or equivalent parts are denoted by the same reference numerals, and their description will not be repeated. Further, the operation in the normal mode of the AD converter 145 is the same as that of the AD converter 141 according to the second embodiment, and the description thereof will not be repeated.

The operation in the test mode is divided into the first stage and the second stage. More specifically, in the first stage, first, the reference potential VREF is inputted to one end of the capacitor Cd configuring the degradation detection capacitor unit 60B. The ground potential AGND is inputted to one end of each MOS capacitor configuring the C-DAC 20. At this time, the switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, VREF×15/16 is inputted to one end of the MOS capacitor under test, and the ground potential AGND is inputted to one end of each of the other MOS capacitors (including Cd). Based on the output of the amplifier 12 at this time, it is determined whether or not there is a capacitance increase corresponding to 1LSB in the MOS capacitor under test.

In the second stage, first, VREF×15/16 is inputted to one end of the capacitor Cd configuring the degradation detection capacitor unit 60B. The ground potential AGND is inputted to one end of each MOS capacitor configuring the C-DAC 20. The switch SW_amp between the input and output nodes of the amplifier 12 is closed; accordingly, the potential of the signal output line 21 is set to the intermediate reference potential between the reference potential VREF and the ground potential AGND. Then, the switch SW_amp between the input and output nodes of the amplifier 12 is switched to the off state, the reference potential VREF is inputted to one end of the MOS capacitor under test, and the ground potential AGND is inputted to one end of each of the other MOS capacitors (including Cd). Based on the output of the amplifier 12 at this time, it is determined whether or not there is a capacitance decrease corresponding to 1LSB in the MOS capacitor under test. Hereinafter, specific description will be made with reference to drawings.

Figure 21:
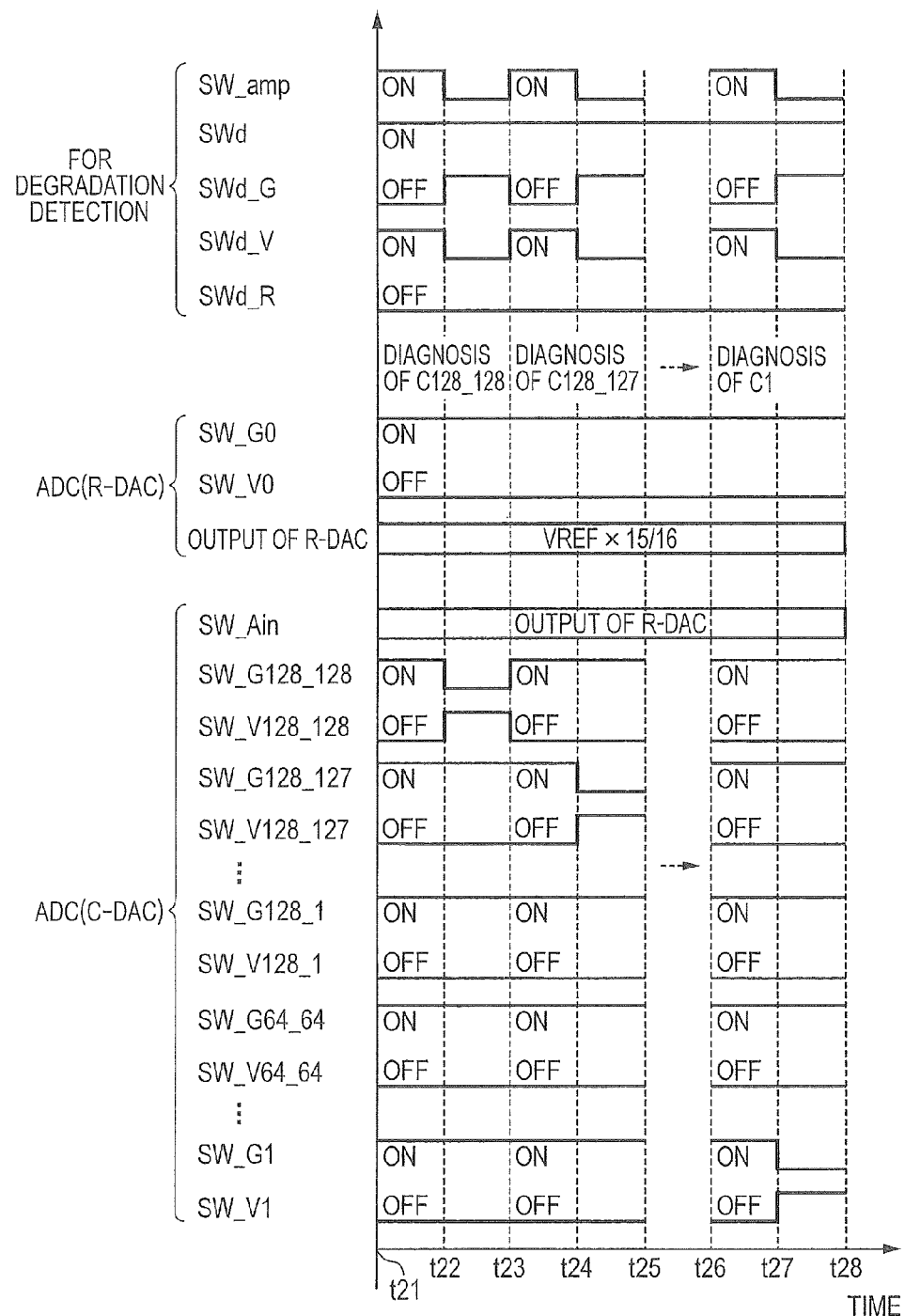
FIG. 21 is a timing chart for explaining the operation in the test mode (first stage) of the AD converter 145 in FIG. 20.

FIG. 21 is a timing chart for explaining the operation in the test mode (first stage) of the AD converter 145 in FIG. 20. Referring to FIGS. 3, 20, and 21, in the test mode (first stage), from the MOS capacitor C128_128 to the MOS capacitor C1, the accuracy of the capacitance value of each capacitor is determined individually in order. In the first stage, the switch SWd is fixed to the on state, and the switch SWd_R is fixed to the off state. The switch SW_G0 coupled to the capacitor C0 is fixed to the on state, and the switch SW_V0 is fixed to the off state. The potential of VREF×(15/16) is outputted from the R-DAC 30. The input side of the switch SW_Ain of the input signal switching unit 40A is fixed to the output of the R-DAC 30.

First, between times t21 and t23, the accuracy of the capacitance value of the capacitor C128_128 is determined. More specifically, between times t21 and t22, the reference potential VREF is inputted to one end of the capacitor Cd in the degradation detection capacitor unit 60B by switching the corresponding switches SWd_V, SWd_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. The ground potential AGND is inputted to one end of each of the capacitor Cd in the degradation detection capacitor unit 60B by switching the corresponding switches SWd_V, SWd_G. Further, in order that VREF×(15/16) is inputted to one end of the capacitor C128_128 under determination, the corresponding switches SW_G128_128, SW_V128_128 are switched. Based on the output of the amplifier 12 at this time, it is determined whether or not there is a capacitance increase corresponding to 1LSB in the capacitor C128_128.

Then, between times t23 and t25, the accuracy of the capacitance value of the MOS capacitor C128_127 is determined. More specifically, between times t23 and t24 as between times t21 and t22, VREF is inputted to one end of the capacitor Cd in the degradation detection capacitor unit 60B, and the ground potential AGND is inputted to one end of each of the other MOS capacitors. The switch SW_amp is turned on; accordingly, the potential of the signal output line 21 is set to the intermediate reference potential between the reference potential VREF and the ground potential AGND. Then, between times t24 and t25, the switch SW_amp is switched to the off state, VREF×(15/16) is inputted to one end of the capacitor C128_127 under determination, and the ground potential AGND is inputted to one end of each of the other MOS capacitors (including Cd). Based on the output of the amplifier 12 at this time, it is determined whether or not there is a capacitance increase corresponding to 1LSB in the capacitor C128_127.

In the same way, it is determined whether or not there is a capacitance increase corresponding to 1LSB in each capacitance value of the MOS capacitors C128_126 to C1.

Figure 22:
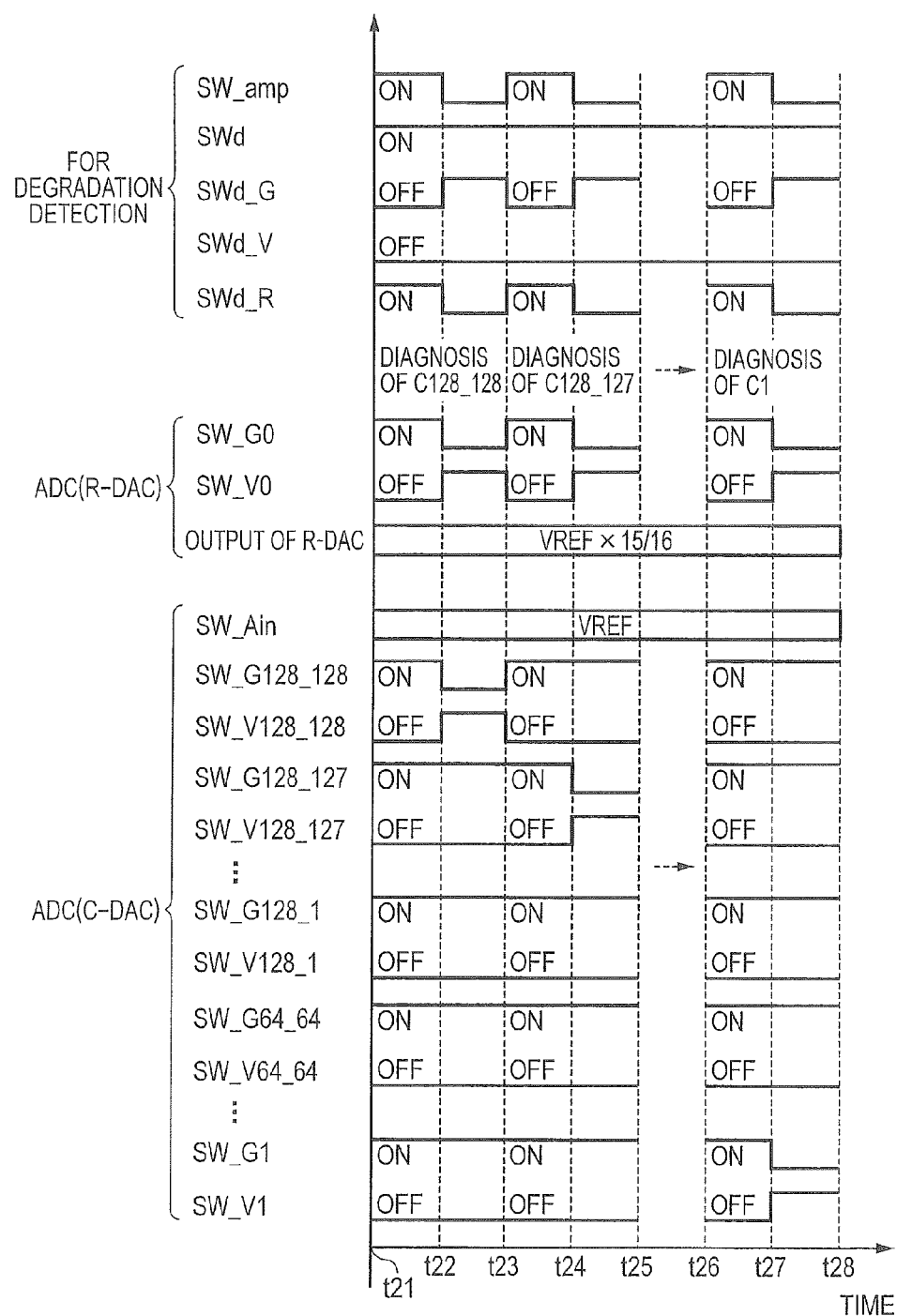
FIG. 22 is a timing chart for explaining the operation in the test mode (second stage) of the AD converter 145 in FIG. 20.

FIG. 22 is a timing chart for explaining the operation in the test mode (second stage) of the AD converter 145 in FIG. 20. Referring to FIGS. 3, 20, and 22, in the test mode (second stage), from the MOS capacitor C128_128 to the MOS capacitor C1, the accuracy of the capacitance value of each capacitor is determined individually in order. In the second stage, the switch SWd is fixed to the on state, and the switch SWd_V is fixed to the off state. The switch SW_G0 coupled to the capacitor C0 is fixed to the on state, and the switch SW_V0 is fixed to the off state. The potential of VREF×(15/16) is outputted from the R-DAC 30. The input side of the switch SW_Ain of the input signal switching unit 40A is fixed to the reference potential VREF.

First, between times t21 and t23, the accuracy of the capacitance value of the capacitor C128_128 is determined. More specifically, between times t21 and t22, VREF×(15/16) is inputted to one end of the capacitor Cd in the degradation detection capacitor unit 60B by switching the corresponding switches SWd_R, SWd_G. The ground potential AGND is inputted to one end of each MOS capacitor configuring the C-DAC 20 by switching the corresponding switches. The switch SW_amp between the input and output nodes of the amplifier 12 is turned on; accordingly, the potential of the signal output line 21 is set to the intermediate reference potential between the reference potential VREF and the ground potential AGND. Alternatively, a predetermined potential may be provided to the signal output line 21.

Then, between times t22 and t23, the switch SW_amp is switched to the off state. The ground potential AGND is inputted to one end of the capacitor Cd in the degradation detection capacitor unit 60B by switching the corresponding switches SWd_V, SWd_G. Further, in order that the reference potential VREF is inputted to one end of the capacitor C128_128 under determination, the corresponding switches SW_G128_128, SW_V128_128 are switched. Based on the output of the amplifier 12 at this time, it is determined whether or not there is a capacitance decrease corresponding to 1LSB in the capacitor C128_128.

Then, between times t23 and t25, the accuracy of the capacitance value of the MOS capacitor C128_127 is determined. More specifically, between times t23 and t24 as between times t21 and t22, VREF×(15/16) is inputted to one end of the capacitor Cd in the degradation detection capacitor unit 60B, and the ground potential AGND is inputted to one end of each of the other MOS capacitors. The switch SW_amp is turned on; accordingly, the potential of the signal output line 21 is set to the intermediate reference potential between the reference potential VREF and the ground potential AGND. Then, between times t24 and t25, the switch SW_amp is switched to the off state, the reference potential VREF is inputted to one end of the capacitor C128_127 under determination, and the ground potential AGND is inputted to one end of each of the other MOS capacitors (including Cd). Based on the output of the amplifier 12 at this time, it is determined whether or not there is a capacitance decrease corresponding to 1LSB in the capacitor C128_127.

In the same way, it is determined whether or not there is a capacitance decrease corresponding to 1LSB in each capacitance value of the MOS capacitors C128_126 to C1.

As described above, according to the AD converter 145 included in the semiconductor device according to the sixth embodiment, it is possible to self-diagnose whether or not the accuracy of the capacitance of each capacitor configuring the C-DAC 20 falls within the range of ±1LSB, which can enhance user convenience. Further, by adjusting the output of the R-DAC 30, it is possible to implement the self-healing function of correcting the output of a capacitor of degraded accuracy.

Modification

While the AD converters according to the above embodiments include the C-DAC as a main DAC and the R-DAC as a sub-DAC, the accuracy determination of the MOS capacitor is also applicable in the case where only the main DAC is included or both the main DAC and the sub-DAC are configured with the C-DAC. However, in the first and second embodiments, it is necessary to supply the potential of VREF×(1/16) corresponding to 1LSB from an external or internal reference potential generation circuit. In the fifth and sixth embodiments, it is necessary to supply the potential of VREF×(15/16) corresponding to 1LSB from an external or internal reference potential generation circuit.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A semiconductor device comprising a successive approximation AD (Analog-to-Digital) converter, the AD converter comprising:
    a switching unit for switching between an analog signal and a reference potential;
    a first DA (Digital-to-Analog) converter including a plurality of first capacitors each having one end that can be individually coupled to the switching unit and the other end coupled to a common output line;
    one or a plurality of testing capacitors that are dedicated for testing, each having one end to which the reference potential or a potential obtained by dividing the reference potential can be individually inputted; and
    a control unit,
    wherein, in a normal mode, the control unit determines a digital value corresponding to the analog signal, based on the output line, and
    wherein, in a test mode, the control unit determines accuracy of a first capacitor under test by comparing a potential of the output line and a potential of the other end of the one or more testing capacitors in a state where the reference potential is inputted to one end of the first capacitor under test.

2. The semiconductor device according to claim 1, wherein the AD converter comprises a second DA converter which includes a plurality of resistive elements and can output a potential obtained by dividing the reference potential by the resistive elements, and
    wherein the first DA converter comprises a second capacitor having one end for receiving an output potential of the second DA converter and the other end coupled to the output line.

3. The semiconductor device according to claim 2, wherein the AD converter comprises first and second testing capacitors as the one or more testing capacitors, and
    wherein, in the test mode, the control unit determines accuracy of the first capacitor under test by comparing a potential of the output line and a potential of the other end of the first and second testing capacitors in a state where the reference potential is inputted to one end of the first testing capacitor, a potential obtained by dividing the reference potential is inputted to one end of the second testing capacitor, and the reference potential is inputted to one end of the first capacitor under test.

4. The semiconductor device according to claim 3, wherein, in the test mode, the control unit further determines accuracy of the first capacitor under test by comparing a potential of the output line and a potential of the other end of the first testing capacitor in a state where the reference potential is inputted to one end of the first testing capacitor, a potential obtained by dividing the reference potential is inputted to one end of the second testing capacitor, and the reference potential is inputted to one end of the first capacitor under test.

5. The semiconductor device according to claim 1,
    wherein each of the first capacitors is formed so as to have a same capacitance value,
    wherein the AD converter comprises first and second testing capacitors as the one or more testing capacitors,
    wherein the first testing capacitor is formed so that a capacitance value thereof is larger than a capacitance value of each first capacitor,
    wherein the second testing capacitor is formed so that a capacitance value thereof is smaller than a capacitance value of each first capacitor, and
    wherein, in the test mode, the control unit executes a first determination operation for determining accuracy of the first capacitor under test by comparing a potential of the output line and a potential of the other end of the first testing capacitor in a state where the reference potential is inputted to one end of the first testing capacitor and the reference potential is inputted to one end of the first capacitor under test, and executes a second determination operation for determining accuracy of the first capacitor under test by comparing a potential of the output line and a potential of the other end of the second testing capacitor in a state where the reference potential is inputted to one end of the second testing capacitor and the reference potential is inputted to one end of the first capacitor under test.

6. The semiconductor device according to claim 2,
    wherein the switching unit can switch among the analog signal, the reference potential, and the output potential of the second DA converter,
    wherein the AD converter comprises first and second testing capacitors as the one or more testing capacitors, and
    wherein, in the test mode, the control unit executes a first determination operation for determining accuracy of the first capacitor under test by comparing a potential of the output line and a potential of the other end of the first testing capacitor in a state where the reference potential is inputted to one end of the first testing capacitor and a potential obtained by dividing the reference potential is inputted to one end of the first capacitor under test, and executes a second determination operation for determining accuracy of the first capacitor under test by comparing a potential of the output line and a potential of the other end of the first testing capacitor in a state where the a potential obtained by dividing the reference potential is inputted to one end of the first testing capacitor and the reference potential is inputted to one end of the first capacitor under test.

* * * * *